US012575129B2

(12) United States Patent
Lee et al.

(10) Patent No.: US 12,575,129 B2
(45) Date of Patent: Mar. 10, 2026

(54) GATES OF HYBRID-FIN DEVICES

(71) Applicant: Taiwan Semiconductor Manufacturing Company, Ltd., Hsin-Chu (TW)

(72) Inventors: Yi-Juei Lee, Hsinchu (TW); Cheng-Tang Li, Hsinchu (TW); Huang-Chao Chang, Hsinchu (TW); Bi-Fen Wu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 730 days.

(21) Appl. No.: 17/815,898

(22) Filed: Jul. 28, 2022

(65) Prior Publication Data

US 2023/0335644 A1     Oct. 19, 2023

Related U.S. Application Data

(60) Provisional application No. 63/331,180, filed on Apr. 14, 2022.

(51) Int. Cl.
| | |
|---|---|
| *H10D 30/62* | (2025.01) |
| *H10D 30/01* | (2025.01) |
| *H10D 84/01* | (2025.01) |
| *H10D 84/03* | (2025.01) |

(52) U.S. Cl.
CPC ..... *H10D 30/6217* (2025.01); *H10D 30/0243* (2025.01); *H10D 84/0158* (2025.01); *H10D 84/038* (2025.01)

(58) Field of Classification Search
USPC ....................................................... 716/100
See application file for complete search history.

(56) References Cited

U.S. PATENT DOCUMENTS

| | | | |
|---|---|---|---|
| 2017/0243861 A1 | 8/2017 | Wang et al. | |
| 2019/0378763 A1* | 12/2019 | Wang ............... | H01L 21/76224 |

FOREIGN PATENT DOCUMENTS

| | | |
|---|---|---|
| KR | 20190024568 A | 3/2019 |
| TW | 201914030 A | 4/2019 |

\* cited by examiner

*Primary Examiner* — Bryce M Aisaka
(74) *Attorney, Agent, or Firm* — HAYNES AND BOONE, LLP

(57) ABSTRACT

An exemplary method includes receiving a hybrid fin device layout for a hybrid fin device that includes a gate disposed over a single-fin active region and a multi-fin active region. The single-fin active region and the multi-fin active region extend lengthwise along a first direction. The gate extends lengthwise along a second direction, the second direction is different than the first direction, and the gate has a width along the first direction. The single-fin active region and a first portion of the gate form a first fin-based device having a first electrical characteristic. The multi-fin active region and a second portion of the gate form a second fin-based device having a second electrical characteristic that is different than the first electrical characteristic. The method further includes tuning the width of the gate to reduce a difference between the first electrical characteristic and the second electrical characteristic.

20 Claims, 13 Drawing Sheets

200

Receive a hybrid fin device layout for a hybrid fin device having a gate structure that is common to a single-fin device and a multi-fin device. — 210

Identify a region of the hybrid fin device that has a negative impact on electrical performance of the hybrid fin device, wherein the region of the hybrid fin device includes a portion of the gate structure. — 215

Adjust a width of the portion of the gate structure to reduce the negative impact on the electrical performance of the hybrid fin device. — 220

Fabricate the hybrid fin device using a modified hybrid fin device layout generated from adjusting the width of the portion of the gate structure. — 225

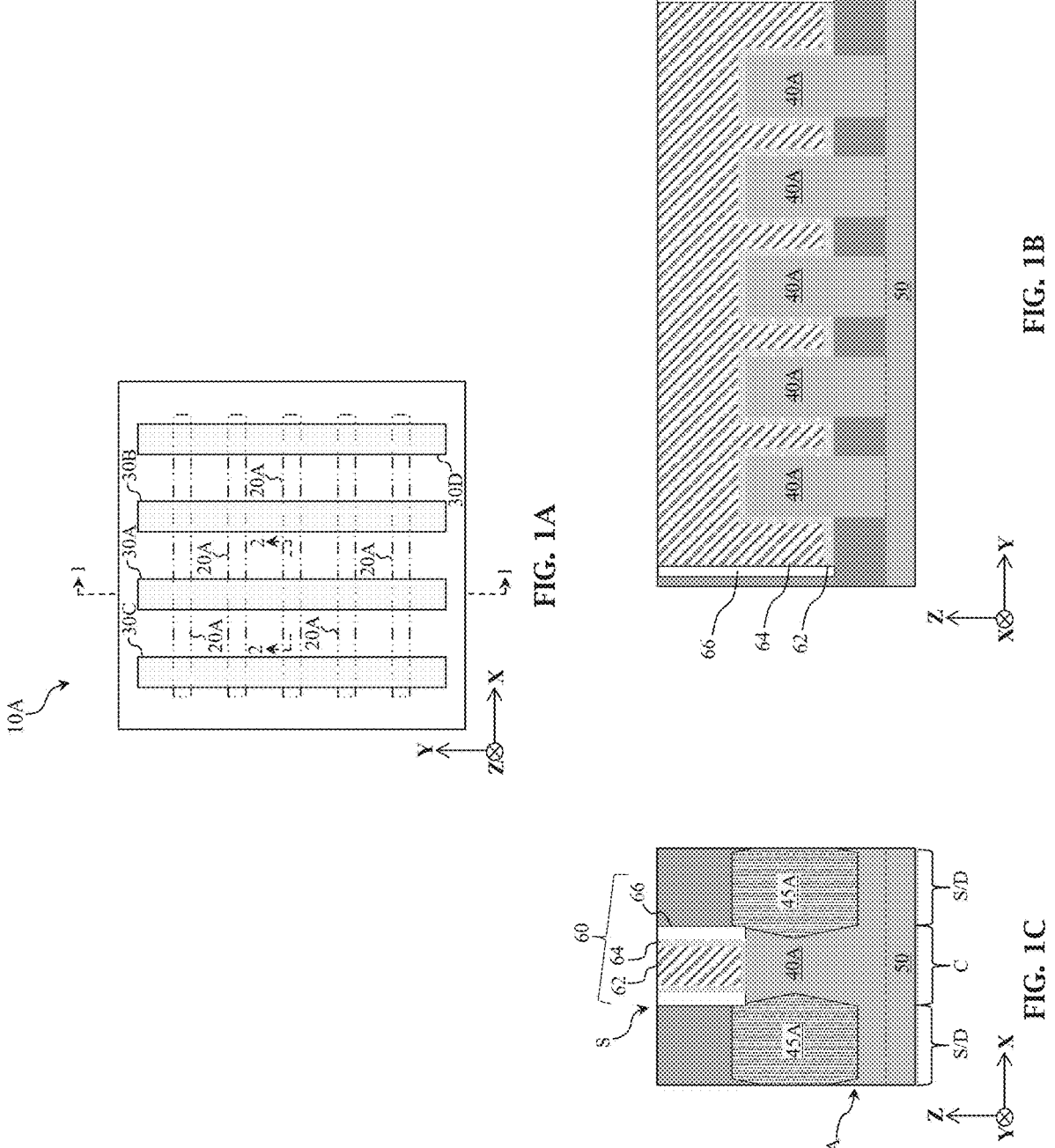

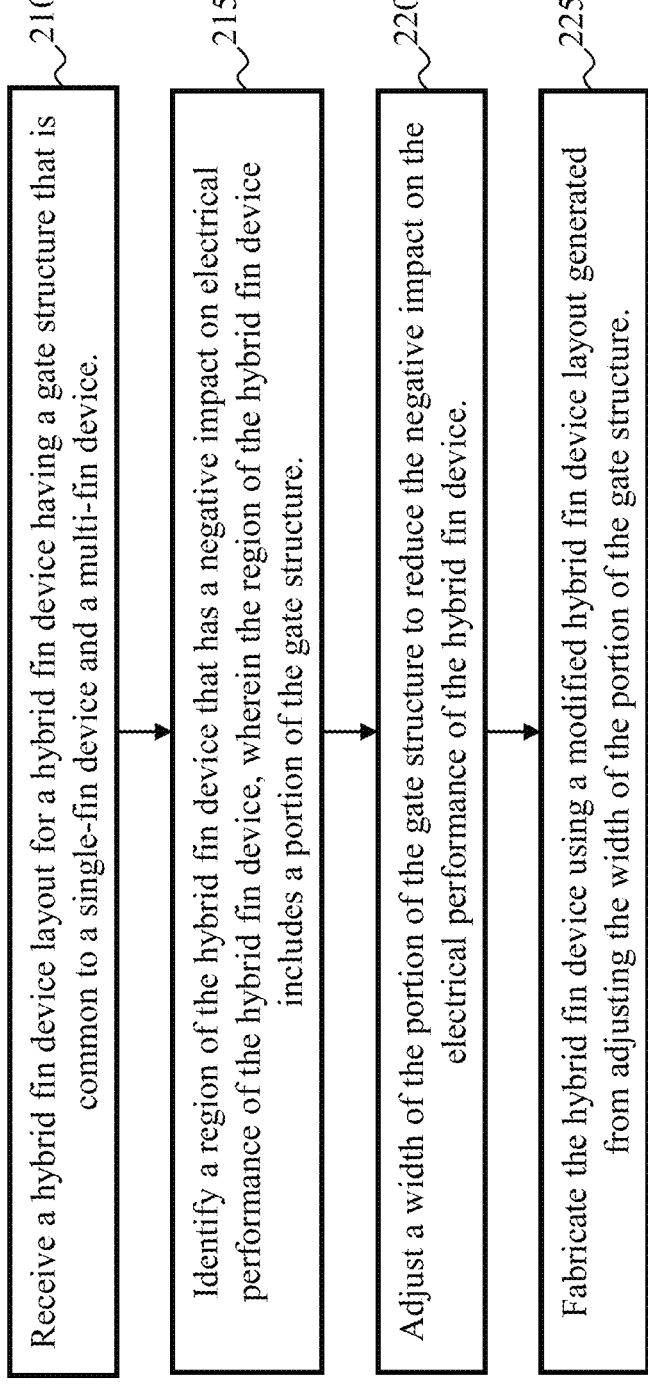

210

Receive a hybrid fin device layout for a hybrid fin device having a gate structure that is common to a single-fin device and a multi-fin device.

215

Identify a region of the hybrid fin device that has a negative impact on electrical performance of the hybrid fin device, wherein the region of the hybrid fin device includes a portion of the gate structure.

220

Adjust a width of the portion of the gate structure to reduce the negative impact on the electrical performance of the hybrid fin device.

225

Fabricate the hybrid fin device using a modified hybrid fin device layout generated from adjusting the width of the portion of the gate structure.

GATES OF HYBRID-FIN DEVICES

The present application is a non-provisional application of and claims benefit of U.S. Patent Application Ser. No. 63/331,180, filed Apr. 14, 2022, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

FIGS. 1A-1C are fragmentary diagrammatic views of a single-fin devices, in portion or entirety, according to various aspects of the present disclosure.

FIG. 9 is a flow chart of a method for optimizing performance of a hybrid fin device according to various aspects of the present disclosure.

DETAILED DESCRIPTION

Figures 2A, 2B, 2C:
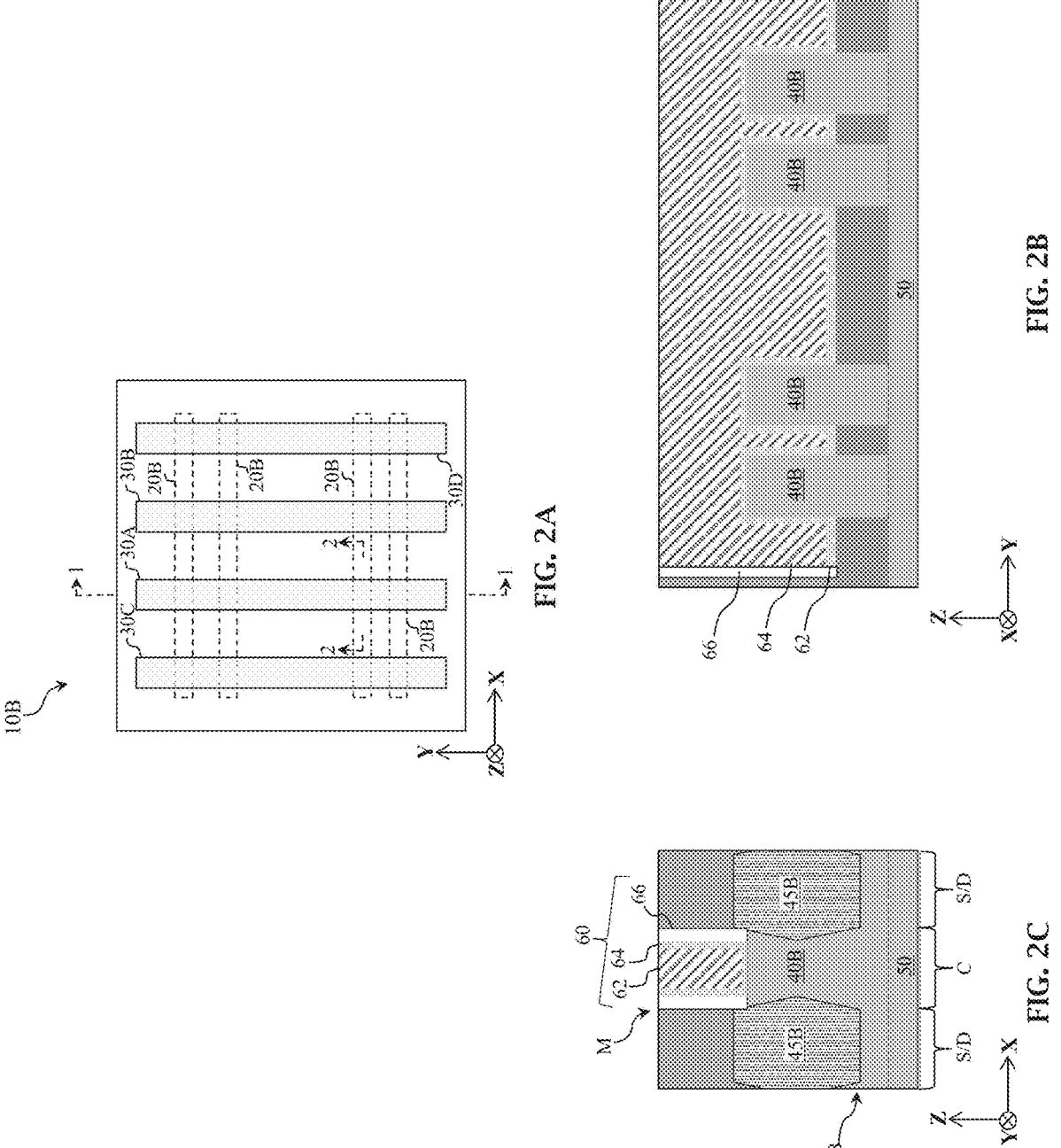
FIGS. 2A-2C are fragmentary diagrammatic views of multi-fin devices, in portion or entirety, according to various aspects of the present disclosure.

The present disclosure is generally related to semiconductor devices, and more particularly, to hybrid fin devices and design and/or fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," "substantially," and the like, the term is intended to encompass numbers that are within a reasonable range considering variations that inherently arise during manufacturing as understood by one of ordinary skill in the art. For example, the number or range of numbers encompasses a reasonable range including the number described, such as within +/-10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/-10% by one of ordinary skill in the art. In another example, two features described as having "substantially the same" dimension and/or "substantially" oriented in a particular direction and/or configuration (e.g., "substantially parallel") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

Hybrid fin devices include gates that span fin active regions having different numbers of fins. For example, a hybrid fin device may include a gate that spans a single-fin active region and a multi-fin active region. A first transistor may be formed from the gate and the single-fin active region, and a second transistor may be formed from the gate and the multi-fin active region. Because the first transistor and the second transistor have different numbers of fins, the first transistor, the second transistor, and features thereof (e.g., respective gate portions, respective source/drains, respective number of channels, etc.) have different dimensions, which can result in the first transistor and the second transistor having different electrical characteristics and/or properties. Differences in the electrical characteristics, such as drain-induced barrier lowering (DIBL), are exacerbated as device dimensions shrink with ever-decreasing integrated circuit (IC) technology nodes. Challenges have thus arisen in configuring hybrid fin devices that optimize performance, density, efficiency, fabrication time, fabrication costs, or combinations thereof.

The present disclosure addresses these challenges by tuning a width of a gate of a hybrid fin device to reduce differences in electrical characteristics of transistors of the hybrid fin device. In some embodiments, a portion of the gate that forms a portion of a single-fin transistor and/or multi-fin transistor is adjusted (e.g., enlarged or reduced) to improve electrical performance thereof. In some embodiments, transistors of the hybrid fin device have substantially the same electrical characteristic after turning the width of the gate, such as substantially the same DIBL. In some embodiments, width adjustments are made to the gate using optical proximity correction (OPC) rules. Performance optimization of hybrid fin devices, as described herein, can seamlessly integrate into existing IC manufacturing processes with minimal change. Different embodiments may have different advantages, and no particular advantage is required of any embodiment.

Figures 3A, 3B, 3C:
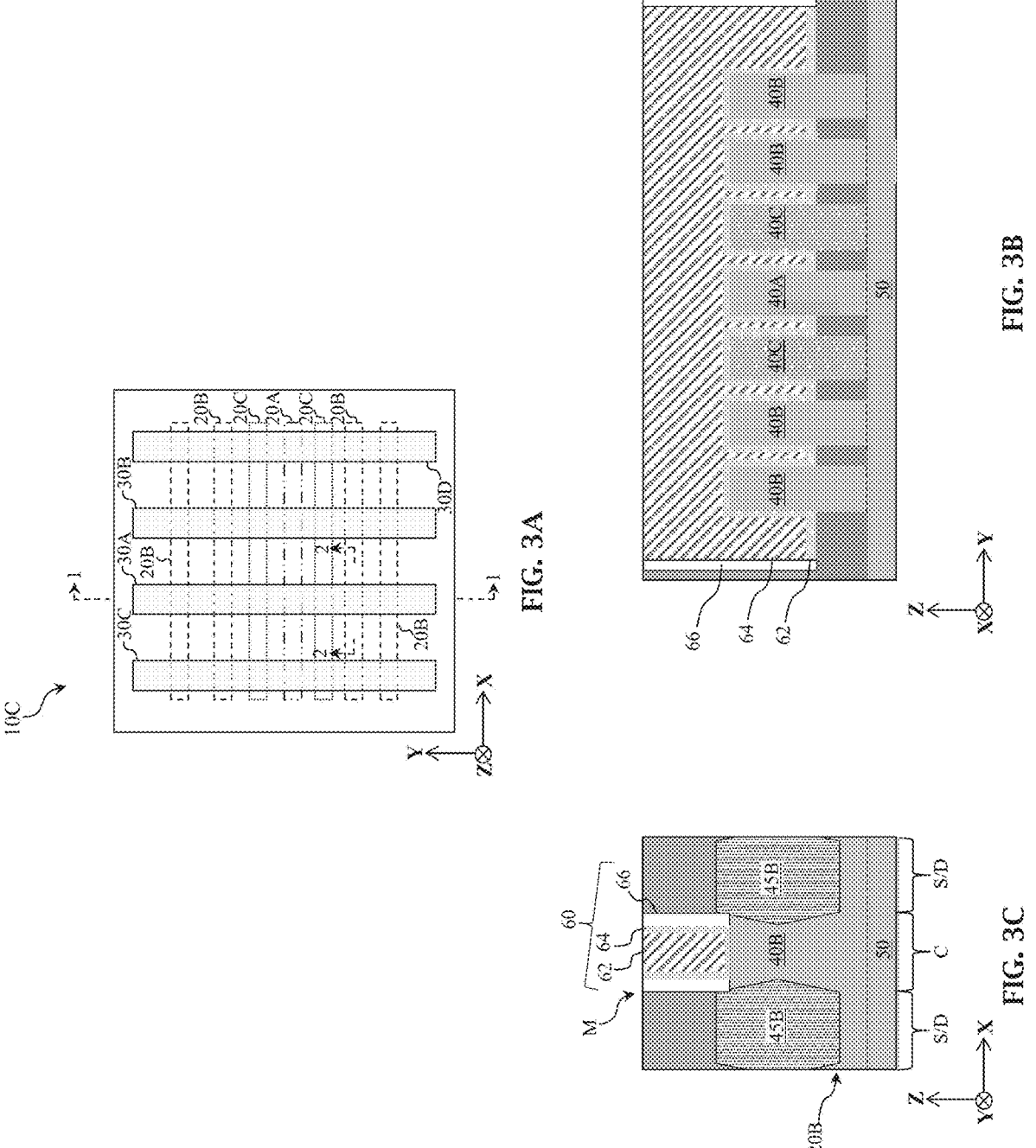
FIGS. 3A-3C are fragmentary diagrammatic views of hybrid fin devices, in portion or entirety, according to various aspects of the present disclosure.

FIGS. 1A-1C depict a non-planar device 10A, FIGS. 2A-2C depict a non-planar device 10B, and FIGS. 3A-3C depict a non-planar device 10C according to various aspects of the present disclosure. FIG. 1A, FIG. 2A, and FIG. 3A are top views of non-planar devices 10A-10C, in portion or entirety, according to various aspects of the present disclosure. FIG. 1B, FIG. 2B, and FIG. 3B are cross-sectional views of non-planar devices 10A-10C, in portion or entirety, along lines 1-1 of FIG. 1A, FIG. 2A, and FIG. 3A, respectively, according to various aspects of the present disclosure. FIG. 1C, FIG. 2C, and FIG. 3C are cross-sectional views of non-planar devices 10A-10C, in portion or entirety, along lines 2-2 of FIG. 1A, FIG. 2A, and FIG. 3A, respectively, according to various aspects of the present disclosure. FIGS. 1A-1C, FIGS. 2A-2C, and FIGS. 3A-3C have been simplified for the sake of clarity to better understand the inventive concepts of the present disclosure. For example, similar features in FIGS. 1A-1C, FIGS. 2A-2C, and FIGS. 3A-3C are identified by the same reference numerals. Additional features can be added in non-planar devices 10A-10C, and some of the features described herein can be replaced, modified, or eliminated in other embodiments of non-planar devices 10A-10C.

Non-planar devices 10A-10C include fin active (OD) regions (lines), such as fin active regions 20A and/or fin active regions 20B, and gate (poly) lines, such as gate lines 30A-30D. Non-planar devices 10A-10C can further include dummy fin region lines, such as dummy fin regions 20C. Fin active regions 20A, fin active regions 20B, and dummy fin regions 20C are oriented substantially parallel to one another and extend lengthwise along the x-direction (i.e., length is along the x-direction, width is along the y-direction, and height is along the z-direction). Gate lines 30A-30D are oriented substantially parallel to one another and extend lengthwise along the y-direction (i.e., length is along the y-direction, width is along the x-direction, and height is along the z-direction). In some embodiments, gate lines 30A-30D are oriented substantially orthogonal to fin active regions 20A, fin active regions 20B, and dummy fin regions 20C.

Fin active regions 20A and fin active regions 20B (also referred to as fins) are electrically functional and provide active fins of electrically functional devices. Fin active regions 20A include semiconductor fins 40A and epitaxial source/drains 45A disposed therein. Fin active regions 20B include semiconductor fins 40B and epitaxial source/drains 45B disposed therein. Semiconductor fins 40A and semiconductor fins 40B extend from a substrate 50, such as a semiconductor substrate. Source/drain region and/or epitaxial source/drain may refer to a source of a device, a drain of a device, or a source and/or a drain of multiple devices.

Dummy fin regions 20C (also referred to as partition fins) are between and separate fin active regions 20A and fin active regions 20B, fin active regions 20A, fin active regions 20B, or combinations thereof. Dummy fin regions 20C are not electrically functional and do not provide active fins of electrically functional devices. Dummy fin regions 20C can include semiconductor fins and/or dielectric fins. Dummy fin regions 20C can electrically and/or physically isolate devices and/or device features. Dummy fin regions 20C can improve patterning fidelity, device uniformity, device manufacturability, etc. In some embodiments, dummy fin regions 20C isolate source/drain regions of multi-fin devices from source/drain regions of single-fin devices. For example, dummy fin regions 20C may prevent unintended merging of epitaxial source/drains of multi-fin devices (e.g., two-fin devices) and epitaxial source/drains of single-fin devices.

Gate lines 30A-30D are active gates, dummy gates, or combinations thereof. In some embodiments, gate line 30A and gate line 30B are active gates, which are electrically functional and provide gates of electrically functional devices, and gate line 30C and gate line 30D are dummy gates, which are electrically non-functional. Dummy gates can physically and/or electrically isolate devices and/or device features, improve patterning fidelity, improve device uniformity, improve device manufacturability, etc. In some embodiments, gate lines 30A-30D include gate structures 60 having a gate stack (e.g., a gate electrode 64 disposed over a gate dielectric 62) and gate spacers 66 disposed along sidewalls of the gate stack.

In FIGS. 1A-1C, non-planar device 10A includes single-fin devices, which generally refers to devices having one fin active region. For example, non-planar device 10A includes one or more single-fin FinFETs. An exemplary single-fin FinFET S is formed from a respective fin active region 20A and a respective portion of gate line 30A. A channel region (C) of single-fin FinFET S can be formed by a portion of a respective semiconductor fin 40A that extends between source/drain regions (S/D), which are provided by epitaxial source/drains 45A. Gate line 30A wraps the portion of the respective semiconductor fin 40A in the y-z plane, and gate line 30A is disposed over the channel region and between epitaxial source/drains 45A. Gate line 30A can engage the channel region of the respective semiconductor fin 40A in a manner that facilitates flow of current through the channel region and between epitaxial source/drains 45A.

In FIGS. 2A-2C, non-planar device 10B includes multi-fin devices, which generally refers to devices having two or more fin active regions. For example, non-planar device 10B includes one or more two-fin FinFETs. An exemplary two-fin FinFET M is formed from two respective fin active regions 20B and a respective portion of gate line 30A. Channel regions of two-fin FinFET M can be formed by portions of respective semiconductor fins 40B that extend between source/drain regions (S/D), which are provided by epitaxial source/drains 45B. Gate line 30A wraps the portions of the respective semiconductor fins 40B in the y-z plane, and gate line 30A is disposed over the channel regions and between epitaxial source/drains 45B. Gate line 30A can engage the channel regions of the respective semiconductor fins 40B in a manner that facilitates flow of current through the channel regions and between epitaxial source/drains 45B. In some embodiments, epitaxial source/drains 45B are provided by epitaxial source/drains of a first one of the two respective fin active regions 20B merged with epitaxial source/drains of a second one of the two respective fin active regions 20B.

In FIGS. 3A-3C, non-planar device 10C is a hybrid fin device that includes single-fin devices and multi-fin devices. For example, non-planar device 10C includes one or more two-fin FinFETs, similar to two-fin FinFET M, and one or more single-fin FinFETs, similar to single-fin FinFET S. In such embodiments, gate lines 30A-30D are common to two-fin FinFETs and single-fin FinFETs. For example, a two-fin FinFET can be formed from two fin active regions 20B and a first portion of gate line 30A and a single-fin FinFET can be formed from one fin active region 20A and a second portion of gate line 30A. In some embodiments, the first portion of gate line 30A and the second portion of gate line 30A are configured differently, such as configured with different gate electrode configurations and/or different gate dielectric configurations. In some embodiments, the first portion and the second portion are configured the same, such as configured with the same gate electrode configurations and/or the same gate dielectric configurations. In some embodiments, the first portion is electrically isolated from the second portion.

In non-planar device 10C, the single-fin FinFETs, the two-fin FinFETs, and partition fin structures have different physical characteristics/properties, such as different numbers of fins (and thus different numbers of channels). The single-fin FinFETs, the two-fin FinFETs, and the partition fin structures may also have different fin spacings (i.e., distance between directly adjacent fins), different fin dimensions (e.g., fin widths along the y-direction), different epitaxial source/drain dimensions (e.g., epitaxial source/drain volumes), other physical characteristic differences, or combinations thereof. Sometimes, the physical characteristic differences contribute to differences in electrical characteristics/properties between the single-fin FinFETs and the two-fin FinFETs, such as differences in drain-induced barrier lowering (DIBL).

Drain-induced barrier lowering (DIBL) is a short channel effect (SCE) that occurs as channel length decreases. Both single-fin FinFETs and two-fin FinFETs have DIBL, and it has been observed that, in hybrid fin devices, DIBL of single-fin FinFETs is different than DIBL of two-fin FinFETs, which can degrade performance of a hybrid fin device. In some instances, single-fin FinFETs may be more susceptible to SCEs, such as DIBL, than two-fin FinFETs because of gate profile differences therebetween. For example, because single-fin FinFETs and two-fin FinFETs have different fin spacings, gates of single-fin FinFETs may have notching that is not (or less prevalent) in gates of two-fin FinFETs, even where the gates are formed from a common gate structure. The present disclosure addresses such challenges by adjusting/tuning widths of the gates to reduce differences in electrical characteristics, such as DIBL, of the single-fin FinFETs and the two-fin FinFETs, such as described herein. In some embodiments, the gate widths are adjusted during an optical proximity correction (OPC) process.

FIGS. 4-8 are diagrammatic top views of a hybrid fin device layout 100, in portion or entirety, that undergoes performance optimization to generate hybrid fin device layouts, in portion or entirety, having improved performance according to various aspects of the present disclosure.

Hybrid fin devices having and/or fabricated from hybrid fin device layout 100-1 (FIG. 4), a hybrid fin device layout 100-2 (FIG. 5), a hybrid fin device layout 100-3 (FIG. 6), a hybrid fin device layout 100-4 (FIG. 7), and a hybrid fin device layout 100-5 (FIG. 8) exhibit improved performance compared to hybrid fin devices having and/or fabricated from hybrid fin layout 100. As described herein, the performance optimization involves modifying gates of hybrid fin device layout 100 to reduce differences in electrical performance of single-fin devices and multi-fin devices thereof. For example, single-fin devices and multi-fin devices of hybrid fin device layouts 100-1-100-5, such as those having common gate structures, exhibit at least one electrical characteristic that is substantially the same, such as the same DIBL. In some embodiments, hybrid fin device layout 100 and hybrid fin device layouts 100-1-100-5 are design layouts used for fabricating hybrid fin devices. In some embodiments, hybrid fin device layout 100 and hybrid fin device layouts 100-1-100-5 are top views of hybrid fin devices. FIGS. 4-8 have been simplified for the sake of clarity to better understand the inventive concepts of the present disclosure. Additional features can be added in hybrid fin device layout 100 and hybrid fin device layouts 100-1-100-5, and some of the features described herein can be replaced, modified, or eliminated in other embodiments of hybrid fin device layout 100 and/or hybrid fin device layout 100-1.

In FIGS. 4-8, hybrid device layout 100 includes single-fin structures 105A (including fin active regions 120A), multi-fin structures 105B (including fin active regions 120B), and partition fin structures 105C (including dummy fin regions 120C), and gate lines 130A-130D. Fin active regions 120A, fin active regions 120B, dummy fin regions 120C, and gate lines 130A-130D are configured and fabricated similar to fin active regions 20A, fin active regions 20B, dummy fin regions 20C, and gate lines 30A-30D, respectively. Gate lines 130A-130D have a width W1 along the x-direction. Width W1 is substantially uniform along lengths of gate lines 130A-130D (e.g., along the y-direction). Gate lines 130A-130D thus have the same width over single-fin structures 105A, multi-fin structures 105B, and partition fin structures 105C. In some embodiments, width W1 is about 3 nm to about 5 nm (e.g., 3 nm).

Single-fin devices, such as single-fin FinFETs, and/or multi-fin devices, such as multi-fin FinFETs, are formed from fin active regions 120A, fin active regions 120B, and gate lines 130A-130D. For example, a single-fin device S1 can be formed from fin active region 120A and a portion of gate line 130A over single-fin structure 105A, a single-fin device S2 can be formed from fin active region 120A and a portion of gate line 130B over single-fin structure 105A, multi-fin devices M1 and M2 can be formed from fin active regions 120B and portions of gate line 130A over multi-fin structures 105B, and multi-fin devices M3 and M4 can be formed from fin active regions 120B and portions of gate line 130B over multi-fin structures 105B.

Single-fin devices and multi-fin devices of hybrid fin device layout 100, such as those having a common gate structure, undesirably exhibit different electrical characteristics/properties. For example, a DIBL of single-fin device S1 is greater than or less than a DIBL of multi-fin device M1 and/or a DIBL of multi-fin device M2, and a DIBL of single-fin device S2 is greater than or less than a DIBL of multi-fin device M3 and/or a DIBL of multi-fin device M4. These electrical characteristic differences can arise because single-fin devices and multi-fin devices have different physical characteristics, such as different numbers of fins (and thus different numbers of channels), different fin spacings, different fin dimensions (e.g., fin widths), different epitaxial source/drain dimensions (e.g., epitaxial source/drain volumes), other different physical characteristics, or combinations thereof. These electrical characteristic differences are exacerbated as device dimensions, such as channel lengths, decrease with scaled IC technology nodes. Modifying gate lines 130A-130D of hybrid fin device layout 100, such as provided in hybrid fin device layouts 100-1-100-5, can minimize these electrical characteristic differences.

Figure 4:
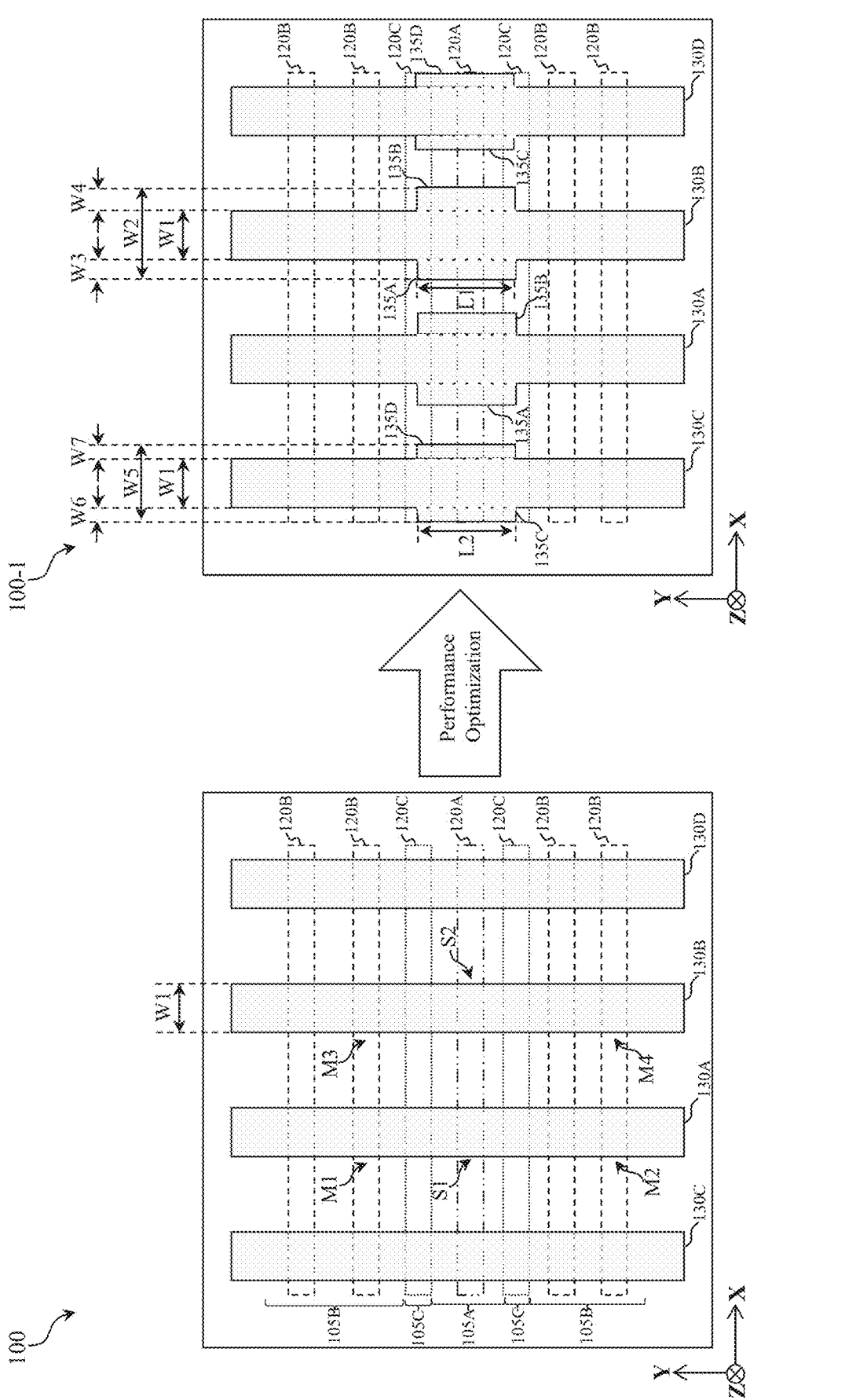
FIGS. 4-8 are diagrammatic top views of a hybrid fin device layout, in portion or entirety, that undergoes performance optimization to generate hybrid fin device layouts, in portion or entirety, according to various aspects of the present disclosure.

Turning to FIG. 4, in modified, hybrid device layout 100-1, widths of gate structures (gate lines) overlying single-fin structures are enlarged to reduce electrical characteristic differences between single-fin devices and multi-fin devices. For example, gate extensions 135A are added to left sides of portions of gate lines 130A, 130B (e.g., active gates) over/on single-fin structure 105A, and gate extensions 135B are added to right sides of portions of gate lines 130A, 130B over/on single-fin structure 105A. A width of gate lines 130A, 130B is thus enlarged from width W1 to width W2 over single-fin structure 105A and/or fin active region 120A, and gate lines 130A, 130B (each of which is common to a single fin device and multi-fin devices) varies along the y-direction. In the depicted embodiment, gate lines 130A, 130B have a wide center and narrow ends. In some embodiments, width W2 is about 5% to about 30% greater than width W1.

Gate extensions 135A have a width W3 along the x-direction, and gate extensions 135B have a width W4 along the x-direction. Gate extensions 135A extend portions of gate lines 130A, 130B over single-fin structure 105A laterally beyond left sidewalls of portions of gate lines 130A, 130B over multi-fin structures 105B by width W3. Gate extensions 135B extend portions of gate lines 130A, 130B over single-fin structure 105A laterally beyond right sidewalls of portions of gate lines 130A, 130B over multi-fin structures 105B by width W4. In some embodiments, width W3 is about 0.15 nm to about 1.0 nm (e.g., 0.8 nm). In some embodiments, width W4 is about 0.15 nm to about 1.0 nm (e.g., 0.8 nm). Width W3 is substantially the same as width W4, as depicted. In some embodiments, width W3 is greater than width W4. In some embodiments, width W3 less than width W4. In some embodiments, gate extensions are added to one side of gate line 130A and/or gate line 130B over single-fin structure 105A, instead of both sides.

A difference in electrical characteristics of single-fin devices formed from portions of gate lines 130A, 130B having width W2 and multi-fin devices formed from portions of gate lines 130A, 130B having width W1 is less than a difference in electrical characteristics of single-fin devices and multi-fin devices formed from gate lines 130A, 130B having width W1, such as in hybrid fin device layout 100. For example, a difference in DIBL of single-fin device S1 and DIBL of multi-fin device M1 and/or DIBL of multi-fin device M2 in modified hybrid fin device layout 100-1 is less than a difference in DIBL of single-fin device S1 and DIBL of multi-fin device M1 and/or DIBL of multi-fin device M2 in hybrid fin device layout 100, and a difference in DIBL of single-fin device S2 and DIBL of multi-fin device M3 and/or DIBL of multi-fin device M4 in modified hybrid fin device layout 100-1 is less than a difference in DIBL of single-fin device S2 and DIBL of multi-fin device M3 and/or DIBL of multi-fin device M4 in hybrid fin device layout 100. In some embodiments, width W3 and/or width W4 are tuned to provide a difference in electrical characteristics (e.g., a difference in DIBLs) of different devices having a common gate structure that is less than or equal to a threshold difference. In some embodiments, the tuning provides DIBL of single-fin devices that is substantially the same as DIBL of multi-fin devices (e.g., DIBL of single-fin device S1≈DIBL of multi-fin device M1, etc.).

In some embodiments, in modified hybrid fin device layout 100-1, gate extensions 135C are added to left sides of portions of gate lines 130C, 130D (e.g., dummy gates) over single-fin structures 105A, and gate extensions 135D are added to right sides of portions of gate lines 130C, 130D over single-fin structures 105A. A width of gate lines 130C, 130D is thus enlarged from width W1 to width W5 over single-fin structure 105A and/or fin active region 120A, and gate lines 130C, 130D vary along the y-direction. In the depicted embodiment, gate lines 130C, 130D have a wide center and narrow ends. In some embodiments, width W5 is about 5% to about 30% greater than width W1. In the depicted embodiment, width W5 is less than width W2. In some embodiments, width W5 is greater than or equal to width W2.

Gate extensions 135C have a width W6 along the x-direction, and gate extensions 135D have a width W7 along the x-direction. Gate extensions 135C extend portions of gate lines 130C, 130D over single fin structure 105A laterally beyond left sidewalls of portions of gate lines 130C, 130D over multi-fin structures 105B by width W6. Gate extensions 135D laterally extend portions of gate lines 130C, 130D over single fin structure 105A beyond right sidewalls of portions of gate lines 130C, 130D over multi-fin structures 105B by width W7. In some embodiments, width W6 and/or width W7 is about 0.15 nm to about 1.0 nm. Width W6 is substantially the same as width W7, as depicted. In some embodiments, width W6 is greater than width W7. In some embodiments, width W6 is less than width W7. In some embodiments, gate extensions are added to one side of gate line 130C and/or gate line 130D over single-fin structure 105A, instead of both sides.

Gate extensions 135A, 135B have a length L1 along the y-direction, and gate extensions 135C, 135D have a length L2 along the y-direction. In FIG. 4, length L1 is substantially the same as length L2, and length L1 and length L2 are each greater than a fin width of fin active region 120A along the y-direction. Length L1 and length L2 are also greater than a sum of the fin width of fin active region 120A and spacings between fin active region 120A and directly adjacent dummy fin regions 120C. Accordingly, gate extensions 135A-135D extend over dummy fin regions 120C, and a width of gate lines 130A-130D is also enlarged from width W1 to width W2 or width W5, respectively, over partition fin structures 105C. Put another way, length L1 and length L2 are greater than a dimension of single-fin structure 105A along the y-direction, and gate extensions 135A-135D extend over portions of widths of dummy fin regions 120C along the y-direction (and/or portions of partition fin structures 105C).

The present disclosure contemplates embodiments where length L1 is greater than or less than length L2, length L1 and/or length L2 is less than the dimension of single-fin structure 105A along the y-direction, some or all gate extensions 135A-135D do not extend over dummy fin regions 120C and/or partition fin structures 105C, some or all of gate extensions 135A-135D extend over an entire width of dummy fin regions 120C along the y-direction, some or all of gate extensions 135A-135D extend over a single dummy fin region 120C and/or partition fin structure 105C, other variation of length L1 and/or length L2, or combinations thereof.

Figure 5:
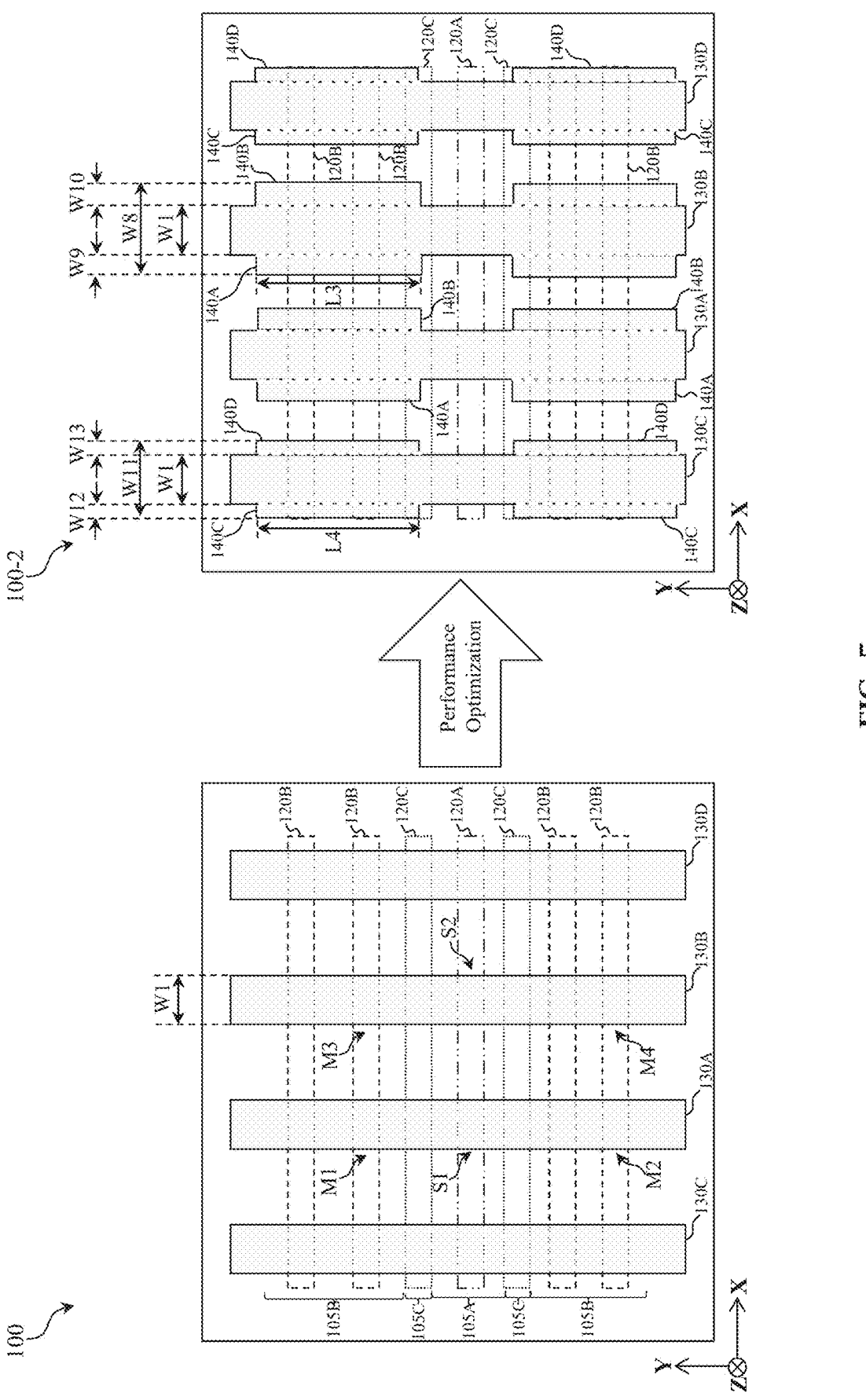

Turning to FIG. 5, in modified, hybrid device layout 100-2, widths of gate structures (gate lines) overlying multi-fin structures are enlarged to reduce electrical characteristic differences between single-fin devices and multi-fin devices. For example, gate extensions 140A are added to left sides of portions of gate lines 130A, 130B over/on multi-fin structures 105B, and gate extensions 140B are added to right sides of portions of gate lines 130A, 130B over/on multi-fin structures 105B. A width of gate lines 130A, 130B is thus enlarged from width W1 to width W8 over multi-fin structures 105B and/or fin active regions 120B, and gate lines 130A, 130B (each of which is common to a single fin device and multi-fin devices) varies along the y-direction. In the depicted embodiment, gate lines 130A, 130B have a narrow center between wide ends. In some embodiments, width W8 is about 5% to about 30% greater than width W1.

Gate extensions 140A have a width W9 along the x-direction, and gate extensions 140B have a width W10 along the x-direction. Gate extensions 140A extend portions of gate lines 130A, 130B over multi-fin structure 105B laterally beyond left sidewalls of portions of gate lines 130A, 130B over single-fin structures 105A by width W9. Gate extensions 140B extend portions of gate lines 130A, 130B over multi-fin structures 105B laterally beyond right sidewalls of portions of gate lines 130A, 130B over single-fin structures 105B by width W10. In some embodiments, width W9 is about 0.15 nm to about 1.0 nm (e.g., 0.8 nm). In some embodiments, width W10 is about 0.15 nm to about 1.0 nm (e.g., 0.8 nm). Width W9 is substantially the same as width W10, as depicted. In some embodiments, width W9 is greater than width W10. In some embodiments, width W9 is less than width W10. In some embodiments, gate extensions are added to one side of gate line 130A and/or gate line 130B over multi-fin structures 105B, instead of both sides.

A difference in electrical characteristics of single-fin devices formed from portions of gate lines 130A, 130B having width W1 and multi-fin devices formed from portions of gate lines 130A, 130B having width W8 is less than a difference in electrical characteristics of single-fin devices and multi-fin devices formed from gate lines 130A, 130B having width W1, such as in hybrid fin device layout 100. For example, a difference in DIBL of single-fin device S1 and DIBL of multi-fin device M1 and/or DIBL of multi-fin device M2 in modified hybrid fin device layout 100-2 is less than a difference in DIBL of single-fin device S1 and DIBL of multi-fin device M1 and/or DIBL of multi-fin device M2 in hybrid fin device layout 100, and a difference in DIBL of single-fin device S2 and DIBL of multi-fin device M3 and/or DIBL of multi-fin device M4 in modified hybrid fin device layout 100-2 is less than a difference in DIBL of single-fin device S2 and DIBL of multi-fin device M3 and/or DIBL of multi-fin device M4 in hybrid fin device layout 100. In some embodiments, width W9 and/or width W10 are tuned to provide a difference in electrical characteristics (e.g., a difference in DIBLs) of different devices having a common gate structure that is less than or equal to a threshold difference. In some embodiments, the tuning provides DIBL of single-fin devices that is substantially the same as DIBL of multi-fin devices (e.g., DIBL of single-fin device S1≈DIBL of multi-fin device M1, etc.).

In some embodiments, in modified hybrid fin device layout 100-2, gate extensions 140C are added to left sides of portions of gate lines 130C, 130D (e.g., dummy gates) over multi-fin structures 105B, and gate extensions 140D are added to right sides of portions of gate lines 130C, 130D over multi-fin structures 105B. A width of gate lines 130C, 130D is thus enlarged from width W1 to width W11 over multi-fin structures 105B and/or fin active regions 120B, and gate lines 130C, 130D vary along the y-direction. In the depicted embodiment, gate lines 130C, 130D have a narrow center between wide ends. In some embodiments, width W11 is about 5% to about 30% greater than width W1. In the depicted embodiment, width W11 is less than width W8. In some embodiments, width W11 is greater than or equal to width W8.

Gate extensions 140C have a width W12 along the x-direction, and gate extensions 140D have a width W13 along the x-direction. Gate extensions 140C laterally extend portions of gate lines 130C, 130D over multi-fin structures 105B beyond left sidewalls of portions of gate lines 130C, 130D over single-fin structure 105A by width W12. Gate extensions 140D laterally extend portions of gate lines 130C, 130D over multi-fin structures 105B beyond right sidewalls of portions of gate lines 130C, 130D over single-fin structure 105A by width W13. In some embodiments, width W12 and/or width W13 is about 0.15 nm to about 1.0 nm. In the depicted embodiment, width W12 is substantially the same as width W13. In some embodiments, width W12 is greater than width W13. In some embodiments, width W12 is less than width W13. In some embodiments, gate extensions are added to one side of gate line 130C and/or gate line 130D over multi-fin structures 105B, instead of both sides.

Gate extensions 140A, 140B have a length L3 along the y-direction, and gate extensions 140C, 140D have a length L4 along the y-direction. In FIG. 5, length L3 is substantially the same as length L4. Length L3 and length L4 are each greater than a sum of fin widths and spacings of fin active regions 120B of respective multi-fin structures 105B along the y-direction. Length L3 and length L4 are also greater than a sum of the fin widths of fin active regions 120B and spacings between fin active regions 120B and directly adjacent dummy fin regions 120C. Accordingly, gate extensions 140A-140D extend over dummy fin regions 120C, and a width of gate lines 130A-130D is also enlarged from width W1 to width W8 or width W11, respectively, over partition fin structures 105C that are directly adjacent to multi-fin structures 105B. Put another way, length L3 and length L4 are greater than a dimension of multi-fin structures 105C along the y-direction, and gate extensions 140A-140D extend over portions of widths of dummy fin regions 120C along the y-direction (and/or portions of partition fin structures 105C). The present disclosure contemplates embodiments where length L3 is greater than or less than length L4, length L3 and/or length L4 is less than the dimensions of multi-fin structures 105B along the y-direction, some or all gate extensions 140A-140D do not extend over dummy fin regions 120C and/or partition fin structures 105C, some or all of gate extensions 140A-140D extend over an entire width of dummy fin regions 120C along the y-direction, some or all of gate extensions 140A-140D extend over one or more dummy fin regions 120C and/or partition fin structures 105C, other variations of length L3 and/or length L4, or combinations thereof.

Figure 6:
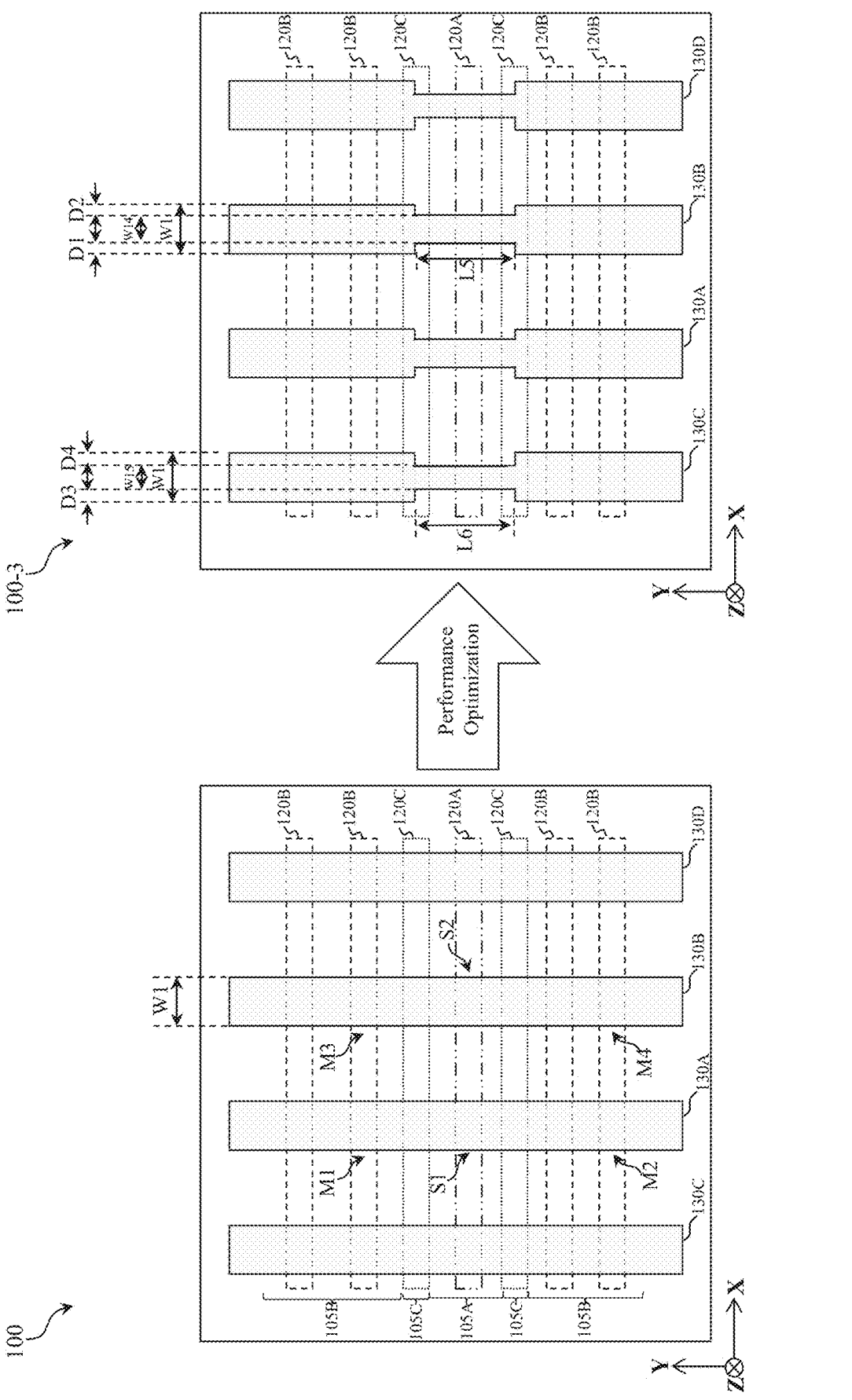

Turing to FIG. 6, in modified, hybrid device layout 100-3, widths of gate structures (gate lines) overlying single-fin structures are reduced to reduce electrical characteristic differences between single-fin devices and multi-fin devices. For example, a width of gate lines 130A, 130B (e.g., active gates) is reduced from width W1 to a width W14 over single-fin structure 105A and/or fin active region 120A, and widths of gate lines 130A, 130B (each of which is common to a single fin device and multi-fin devices) vary along the y-direction. In the depicted embodiment, gate lines 130A, 130B have a narrow center between wide ends. In some embodiments, width W14 is about 5% to about 30% less than width W1.

Gate width reduction can be achieved by shifting sidewalls of portions of gate lines 130A, 130B over single fin structures 105A inward relative to sidewalls of portions of gate lines 130A, 130B over multi-fin structures 105B. For example, left sidewalls of portions of gate lines 130A, 130B over single-fin structures 105A are shifted right by a distance D1 from sidewalls of portions of gate lines 130A, 130B over multi-fin structures 105B, and right sidewalls of portions of gate lines 130A, 130B over single-fin structures 105A are shifted left by a distance D2 from sidewalls of portions of gate lines 130A, 130B over multi-fin structures 105B. In some embodiments, distance D1 and/or distance D2 is about 0.15 nm to about 1.0 nm. Distance D1 is substantially the same as distance D2, as depicted. In some embodiments, distance D1 is greater than distance D2. In some embodiments, distance D1 is less than distance D2. In some embodiments, sidewalls of one side of gate line 130A and/or gate line 130B over single-fin structures 105A are shifted inward, instead of both sides.

A difference in electrical characteristics of single-fin devices formed from portions of gate lines 130A, 130B having width W14 and multi-fin devices formed from portions of gate lines 130A, 130B having width W1 is less than a difference in electrical characteristics of single-fin devices and multi-fin devices formed from gate lines 130A, 130B having width W1, such as in hybrid fin device layout 100. For example, a difference in DIBL of single-fin device S1 and DIBL of multi-fin device M1 and/or DIBL of multi-fin device M2 in modified hybrid fin device layout 100-3 is less than a difference in DIBL of single-fin device S1 and DIBL of multi-fin device M1 and/or DIBL of multi-fin device M2 in hybrid fin device layout 100, and a difference in DIBL of single-fin device S2 and DIBL of multi-fin device M3 and/or DIBL of multi-fin device M4 in modified hybrid fin device layout 100-3 is less than a difference in DIBL of single-fin device S2 and DIBL of multi-fin device M3 and/or DIBL of multi-fin device M4 in hybrid fin device layout 100. In some embodiments, distance D1 and/or distance D2 are tuned to provide a difference in electrical characteristics (e.g., a difference in DIBLs) of different devices having a common gate structure that is less than or equal to a threshold difference. In some embodiments, the tuning provides DIBL of single-fin devices that is substantially the same as DIBL of multi-fin devices (e.g., DIBL of single-fin device S1≈DIBL of multi-fin device M1, etc.).

In some embodiments, a width of gate lines 130C, 130D (e.g., dummy gates) is reduced from width W1 to a width W15 over single-fin structure 105A and/or fin active region 120A, and widths of gate lines 130C, 130D vary along the y-direction (e.g., gate lines 130C, 130D have a narrow center between wide ends). In some embodiments, width W15 is about 5% to about 30% less than width W1. In the depicted embodiment, width W15 is less than width W14. In some embodiments, width W15 is greater than or equal to width W14.

Gate width reduction of gate lines 130C, 130D can be achieved by shifting sidewalls of portions of gate lines 130C, 130D over single fin structures 105A inward relative to sidewalls of portions of gate lines 130C, 130D over multi-fin structures 105B. For example, left sidewalls of portions of gate lines 130C, 130D over single-fin structures 105A are shifted right by a distance D3 from sidewalls of portions of gate lines 130C, 130D over multi-fin structures 105B, and right sidewalls of portions of gate lines 130C, 130D over single-fin structures 105A are shifted left by a distance D4 from sidewalls of portions of gate lines 130C, 130D over multi-fin structures 105B. In some embodiments, distance D3 and/or distance D4 is about 0.15 nm to about 1.0 nm. Distance D3 is substantially the same as distance D4, as depicted. In some embodiments, distance D3 is greater than distance D4. In some embodiments, distance D3 is less than distance D4. In some embodiments, sidewalls of one side of gate line 130C and/or gate line 130D over single-fin structures 105A are shifted inward, instead of both sides.

Portions of gate lines 130A, 130B over single-fin structures 105A having a reduced width, such as width W14, have a length L5 along the y-direction, and portions of gate lines 130C, 130D over single-fin structures 105A having a reduced width, such as width W15, have a length L6 along the y-direction. Length L5 and length L6 are similar to and may be configured similar to length L1 and length L2, respectively, as described above.

Figure 7:
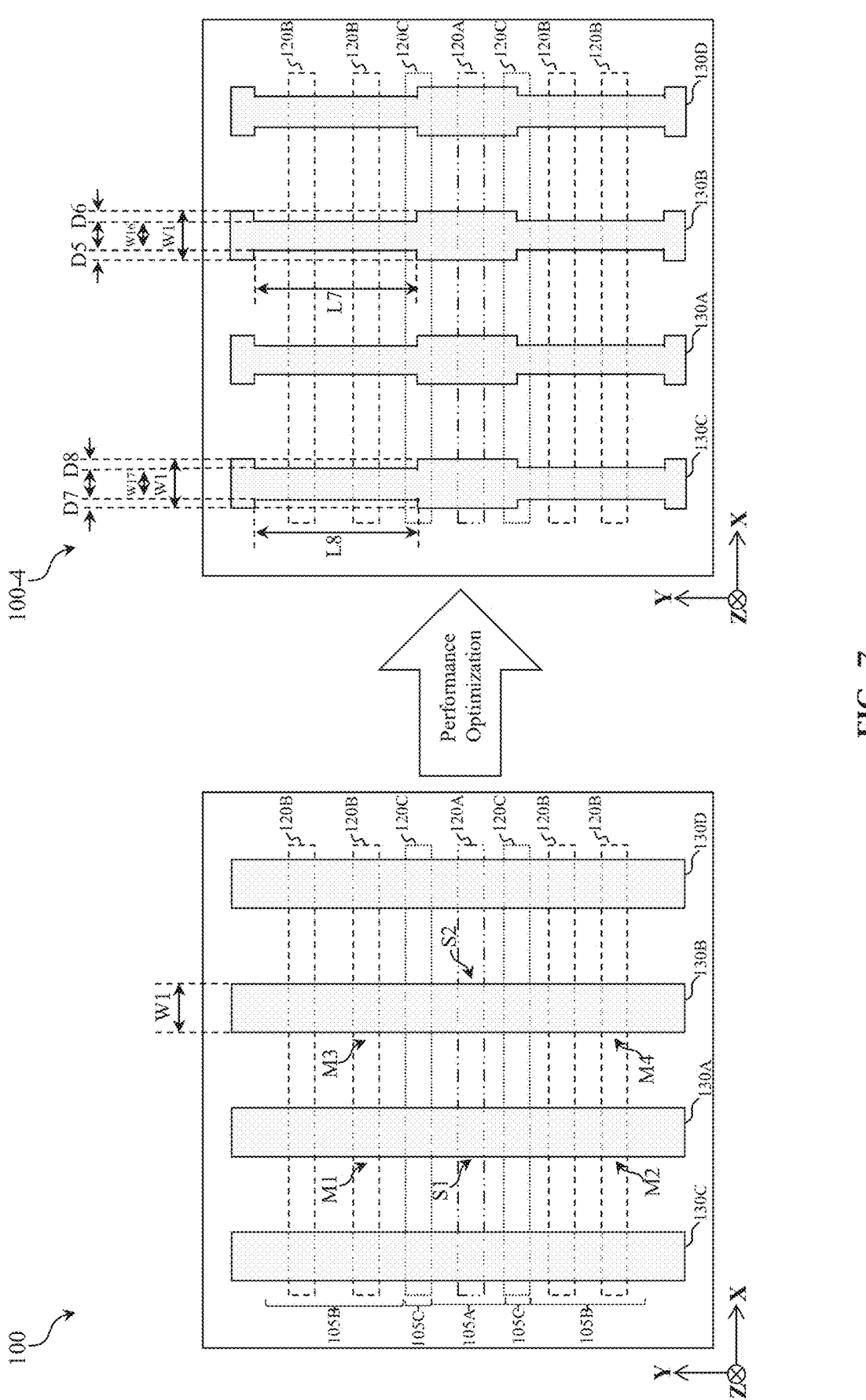

Turing to FIG. 7, in modified, hybrid device layout 100-4, widths of gate structures (gate lines) overlying multi-fin structures are reduced to reduce electrical characteristic differences between single-fin devices and multi-fin devices. For example, a width of gate lines 130A, 130B (e.g., active gates) is reduced from width W1 to a width W16 over multi-fin structures 105B and/or fin active regions 120B, and widths of gate lines 130A, 130B (each of which is common to a single fin device and multi-fin devices) vary along the y-direction. In the depicted embodiment, gate lines 130A, 130B have a wide center between narrow ends. In some embodiments, width W16 is about 5% to about 30% less than width W1.

Gate width reduction can be achieved by shifting sidewalls of portions of gate lines 130A, 130B over multi-fin structures 105B inward relative to sidewalls of portions of gate lines 130A, 130B over single-fin structures 105A. For example, left sidewalls of portions of gate lines 130A, 130B over multi-fin structures 105B are shifted right by a distance D5 from sidewalls of portions of gate lines 130A, 130B over single-fin structures 105A, and right sidewalls of portions of gate lines 130A, 130B over multi-fin structures 105B are shifted left by a distance D6 from sidewalls of portions of gate lines 130A, 130B over single-fin structures 105A. In some embodiments, distance D5 and/or distance D6 is about 0.15 nm to about 1.0 nm. Distance D5 is substantially the same as distance D6, as depicted. In some embodiments, distance D5 is greater than distance D6. In some embodiments, distance D5 is less than distance D6. In some embodiments, sidewalls of one side of gate line 130A and/or gate line 130B over multi-fin structures 105A are shifted inward, instead of both sides.

A difference in electrical characteristics of single-fin devices formed from portions of gate lines 130A, 130B having width W1 and multi-fin devices formed from portions of gate lines 130A, 130B having width W16 is less than a difference in electrical characteristics of single-fin devices and multi-fin devices formed from gate lines 130A, 130B having width W1, such as in hybrid fin device layout 100. For example, a difference in DIBL of single-fin device S1 and DIBL of multi-fin device M1 and/or DIBL of multi-fin device M2 in modified hybrid fin device layout 100-4 is less than a difference in DIBL of single-fin device S1 and DIBL of multi-fin device M1 and/or DIBL of multi-fin device M2 in hybrid fin device layout 100, and a difference in DIBL of single-fin device S2 and DIBL of multi-fin device M3 and/or DIBL of multi-fin device M4 in modified hybrid fin device layout 100-4 is less than a difference in DIBL of single-fin device S2 and DIBL of multi-fin device M3 and/or DIBL of multi-fin device M4 in hybrid fin device layout 100. In some embodiments, distance D5 and/or distance D6 are tuned to provide a difference in electrical characteristics (e.g., a difference in DIBLs) of different devices having a common gate structure that is less than or equal to a threshold difference. In some embodiments, the tuning provides DIBL of single-fin devices that is substantially the same as DIBL of multi-fin devices (e.g., DIBL of single-fin device S1≈DIBL of multi-fin device M1, etc.).

In some embodiments, a width of gate lines 130C, 130D (e.g., dummy gates) is reduced from width W1 to a width W17 over multi-fin structures 105B and/or fin active regions 120B, and widths of gate lines 130C, 130D vary along the y-direction (e.g., gate lines 130C, 130D have a wide center between narrow ends). In some embodiments, width W17 is about 5% to about 30% less than width W1. In the depicted embodiment, width W17 is greater than width W16. In some embodiments, width W17 is less than or equal to width W16.

Gate width reduction of gate lines 130C, 130D can be achieved by shifting sidewalls of portions of gate lines 130C, 130D over multi-fin structures 105B inward relative to sidewalls of portions of gate lines 130A, 130B over single-fin structures 105A. For example, left sidewalls of portions of gate lines 130C, 130D over multi-fin structures 105B are shifted right by a distance D7 from sidewalls of portions of gate lines 130C, 130D over single-fin structures 105A, and right sidewalls of portions of gate lines 130C, 130D over multi-fin structures 105B are shifted left by a distance D8 from sidewalls of portions of gate lines 130C, 130D over single-fin structures 105A. In some embodiments, distance D7 and/or distance D8 is about 0.15 nm to about 1.0 nm. Distance D7 is substantially the same as distance D8, as depicted. In some embodiments, distance D7 is greater than distance D8. In some embodiments, distance D7 is less than distance D8. In some embodiments, sidewalls of one side of gate line 130C and/or gate line 130D over multi-fin structures 105B are shifted inward, instead of both sides.

Portions of gate lines 130A, 130B over multi-fin structures 105B having a reduced width, such as width W16, have a length L7 along the y-direction, and portions of gate lines 130C, 130D over multi-fin structures 105B having a reduced width, such as width W17, have a length L8 along the y-direction. Length L7 and length L8 are similar to and may be configured similar to length L3 and length L4, respectively, as described above.

Figure 8:
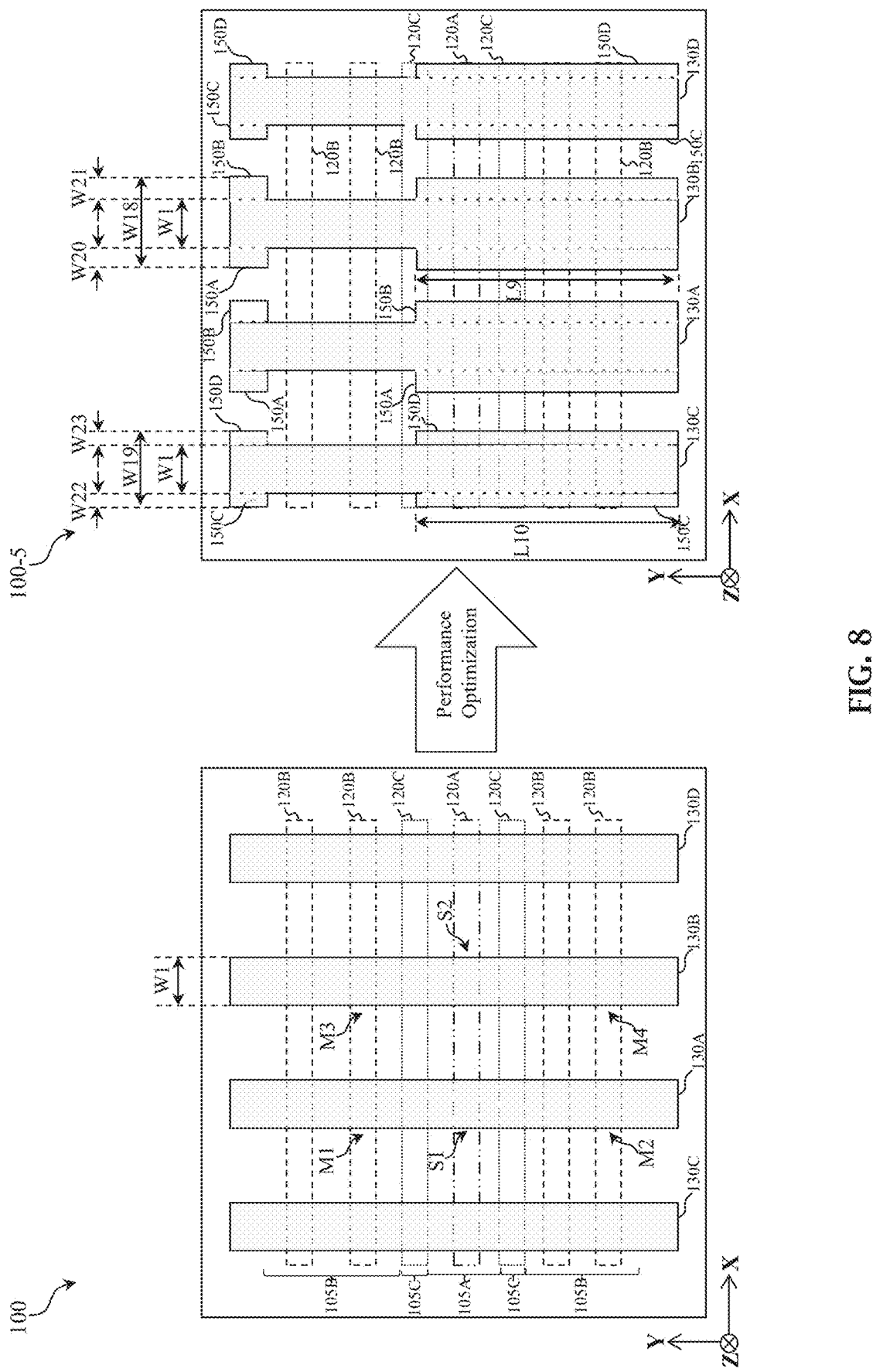

Turing to FIG. 8, in modified, hybrid device layout 100-5, widths of gate structures (gate lines) are adjusted to improve electrical performance of a hybrid fin device, for example, by reducing leakage current of the hybrid fin device. In some embodiments, a simulation process based on hybrid fin device layout 100 is performed to generate a simulated hybrid fin device, which is used to identify hotspots of hybrid fin device layout 100, such as regions of hybrid fin device layout 100 that may be prone to or exhibit higher than desirable leakage current based on electrical characteristics of the simulated hybrid fin device. For example, gate extensions 150A are added to left sides of portions of gate lines 130A, 130B over/on single-fin structures 105A and multi-fin structures 105B that correspond with hotspots, and gate extensions 150B are added to right sides of portions of gate lines 130A, 130B over/on single-fin structures 105A and multi-fin structures 105B that correspond with hotspots. A width of gate lines 130A, 130B is thus enlarged from width W1 to width W18 over select single-fin structures 105A (and/or fin active regions 120A) and multi-fin structures 105B (and/or fin active regions 120B), and gate lines 130A, 130B (each of which is common to a single fin device and multi-fin devices) varies along the y-direction. In some embodiments, width W18 is about 5% to about 30% greater than width W1.

Gate extensions 150A have a width W20 along the x-direction, and gate extensions 150B have a width W21 along the x-direction. Gate extensions 150A extend portions of gate lines 130A, 130B over single-fin structure 105A and bottom multi-fin structure 105B laterally beyond left sidewalls of portions of gate lines 130A, 130B over top multi-fin structure 105B by width W20. Gate extensions 150B extend portions of gate lines 130A, 130B over single-fin structure 105A and bottom multi-fin structure 105B laterally beyond right sidewalls of portions of gate lines 130A, 130B over top multi-fin structures 105B by width W21. In some embodiments, width W20 is about 0.15 nm to about 1.0 nm. In some embodiments, width W21 is about 0.15 nm to about 1.0 nm. Width W20 is substantially the same as width W21, as depicted. In some embodiments, width W20 is greater than width W21. In some embodiments, width W20 is less than width W21. In some embodiments, gate extensions are added to one side of gate line 130A and/or gate line 130B over single-fin structure 105A and bottom multi-fin structure 105B, instead of both sides.

In some embodiments, in modified hybrid fin device layout 100-5, gate extensions 150C are added to left sides of portions of gate lines 130C, 130D (e.g., dummy gates) over/on single-fin structures 105A and multi-fin structures 105B that correspond with hotspots, and gate extensions 150D are added to right sides of portions of gate lines 130C, 130D over/on single-fin structures 105A and multi-fin structures 105B that correspond with hotspots. A width of gate lines 130C, 130D is thus enlarged from width W1 to width W19 over select single-fin structures 105A (and/or fin active regions 120A) and multi-fin structures 105B (and/or fin active regions 120B), and gate lines 130C, 130D vary along the y-direction. In some embodiments, width W19 is about 5% to about 30% greater than width W1. In the depicted embodiment, width W19 is less than width W18. In some embodiments, width W19 is greater than or equal to width W18.

Gate extensions 150C have a width W22 along the x-direction, and gate extensions 150D have a width W23 along the x-direction. Gate extensions 150C laterally extend portions of gate lines 130C, 130D over single-fin structure 105A and bottom multi-fin structure 105B beyond left sidewalls of portions of gate lines 130C, 130D over top multi-fin structure 105B by width W22. Gate extensions 150D laterally extend portions of gate lines 130C, 130D over single-fin structure 105A and bottom multi-fin structure 105B beyond right sidewalls of portions of gate lines 130C, 130D over top multi-fin structure 105B by width W23. In some embodiments, width W22 and/or width W23 is about 0.15 nm to about 1.0 nm. In the depicted embodiment, width W22 is substantially the same as width W23. In some embodiments, width W22 is greater than width W23. In some embodiments, width W22 is less than width W23. In some embodiments, gate extensions are added to one side of gate line 130C and/or gate line 130D over single-fin structure 105A and bottom multi-fin structure 105B, instead of both sides.

Gate extensions 150A, 150B have a length L9 along the y-direction, and gate extensions 150C, 150D have a length L10 along the y-direction. In FIG. 8, length L9 is substantially the same as length L10. Length L9 and length L10 are each greater than a sum of fin widths and spacings of fin active regions 120B of bottom multi-fin structures 105B, fin active region 120A of single-fin structure 105A, and dummy fin region 120C of partition fin structure 105C therebetween along the y-direction. The present disclosure contemplates embodiments with variations of length L9 and/or length L10, such as described herein.

FIG. 9 is a flow chart of a method 200 for optimizing performance of a hybrid fin device according to various aspects of the present disclosure. Method 200 implements the concepts described herein to optimize electrical performance of hybrid fin devices, for example, by reducing differences in electrical characteristics of fin-based devices having different numbers of fins. Method 200 beings at block 210 with receiving a hybrid fin device layout for a hybrid fin device, such as hybrid fin device layout 100. The hybrid fin device has a gate structure that is common to a single-fin device and a multi-fin device. The common gate structure can include a gate stack and gate spacers, and the gate stack can include a gate electrode and a gate dielectric. The gate electrode and/or the gate dielectric may be configured differently for the single-fin device and the multi-fin device (e.g., different materials, different numbers of layers, etc.).

At block 215, method 200 includes identifying a region of the hybrid fin device that has a negative impact on electrical performance of the hybrid fin device. In some embodiments, identifying the region includes performing a rule-based OPC process and/or a model-based OPC process, where the region of the hybrid fin device is defined by an OPC rule (e.g., an OPC rule may specify that the single-fin device exhibits greater DIBL than the multi-fin device). In some embodiments, identifying the region includes simulating electrical performance of the hybrid fin device based on the hybrid fin device layout and identifying an electrical characteristic difference between the single-fin device and the multi-fin device. Method 200 may determine that the electrical characteristic difference is greater than a given, allowable threshold difference (e.g., electrical characteristic differences greater than the threshold difference may degrade performance of the hybrid fin device). As an example, where a DIBL of a simulated single-fin device is different than a DIBL of a simulated multi-fin device, the single-fin device or the multi-fin device is identified as the region of the hybrid fin device that negatively impacts electrical performance. In some embodiments, identifying the region includes simulating electrical performance of the hybrid fin device based on the hybrid fin device layout and identifying hotspots of the simulated hybrid fin device. In some embodiments, the hotspots are regions of the hybrid fin device that correspond with regions of a simulated hybrid fin device that exhibit or are prone to current leakage.

The region of the hybrid fin device includes a portion of the gate structure. In some embodiments, the portion of the gate structure is over a single-fin structure (e.g., fin active region 120A) of the single-fin device. In some embodiments, the portion of the gate structure is over a multi-fin structure (e.g., two fin active regions 120B) of the multi-fin device. In some embodiments, the portion of the gate structure is over a partition fin structure (e.g., dummy fin region 120C). In some embodiments, the gate structure is common to multiple single-fin devices and multiple multi-fin devices, and the portion of the gate structure corresponds with a region of the hybrid fin device that exhibits sub-optimal performance, such as a region that is susceptible to current leakage. In such embodiments, the portion of the gate structure may be over a respective single-fin structure, a respective multi-fin structure, and a respective partition fin structure.

At block 220, method 200 includes adjusting a width of the portion of the gate structure to reduce the negative impact on the electrical performance of the hybrid fin device by the region of the hybrid fin device. Adjusting the width can include increasing or decreasing the width of the portion of the gate structure, thereby generating a modified hybrid fin device layout, such as modified hybrid fin device layouts 100-1-100-5. Increasing the width can include adding one or more jogs to sides of the portion of the gate structure. In some embodiments, adjusting the width of the portion of the gate structure reduces an electrical characteristics difference between the single-fin device and the multi-fin device. For example, single-fin device and the multi-fin device have substantially the same DIBL after adjusting the width, which improves overall performance of the hybrid fin device. In some embodiments, adjusting the width of the portion of the gate structure reduces hotspots and/or current leakage associated with the identified region of the hybrid fin device, which improves overall performance of the hybrid fin device. In some embodiments, the width is adjusted based on one or more OPC rules. In such embodiments, the jogs may be referred to as OPC features and applied to the gate structure based on the OPC rules.

Method 200 can proceed to block 225, where a hybrid fin device is fabricated using the modified hybrid fin device layout. For example, a fabricated hybrid fin device has a gate structure (e.g., a gate stack and gate spacers) common to a single-fin device and a multi-fin device. The gate structure has a first width over a single-fin structure of the single-fin device and a second width over a multi-fin structure of the multi-fin device. The first width and the second width are different. In some embodiments, the gate structure has the first width or the second width in the hybrid fin device layout. In some embodiments, the gate structure is further common to a fin partition structure between the single-fin device and the multi-fin device. The gate structure can have the first width, the second width, or both the first width and the second width over the fin partition structure. In some embodiments, the width, the first width, and the second width are widths of a gate stack along a fin lengthwise direction. In some embodiments, the width, the first width, and the second width are sums of a width of a gate stack and two times a width of gate spacers along a fin lengthwise direction. FIG. 9 has been simplified for the sake of clarity to better understand the inventive concepts of the present disclosure. Additional steps can be provided before, during, and after method 200, and some of the steps described can be moved, replaced, or eliminated for additional embodiments of method 200.

Figure 10:
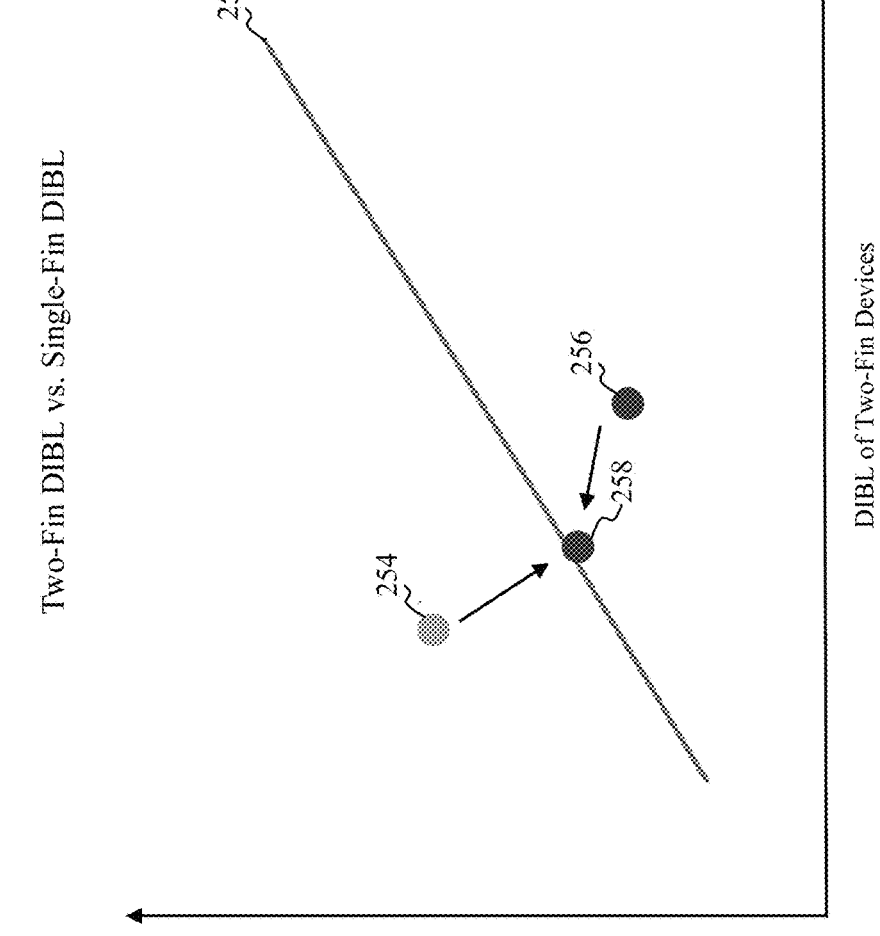
FIG. 10 is a plot of drain-induced barrier lowering (DIBL) of multi-fin devices as a function of DIBL of single-fin devices according to various aspects of the present disclosure.

FIG. 10 is an exemplary plot 250 of DIBL of two-fin devices as a function of DIBL of single-fin devices according to various aspects of the present disclosure. In FIG. 10, a line 252 corresponds with points where DIBL of two-fin devices are substantially the same as DIBL of single-fin devices of a hybrid fin device. Data point 254 and data point 256 correspond with DIBL metrics before performance optimization of a hybrid fin device layout (e.g., hybrid fin device layout 100), and data point 258 corresponds with DIBL after performance optimization of the hybrid fin device layout (e.g., hybrid fin device layouts 100-1-100-5). Data point 254 indicates that DIBL of the single-fin devices is greater than DIBL of the two-fin devices, and data point 256 indicates DIBL of the two-fin devices is less than DIBL of the single-fin device. Data point 258 indicates that DIBL of the single-fin devices is substantially the same as DIBL of the two-fin devices after performance optimization. Adjusting/tuning widths of gate structures of the hybrid fin device, such as widths of gate structures common to the single-fin devices and the two-fin devices, compensates for DIBL differences thereof. In some embodiments, increasing a width of a portion of a gate structure that corresponds with a single-fin device (for example, by applying jogs thereto) relative to a portion of the gate structure that corresponds with a two-fin device improves DIBL of the single-fin device, such that the DIBL of the single-fin device is substantially the same as the DIBL of the two-fin device. In some embodiments, DIBL of the single-fin structure may be reduced about 5 mV/V to about 10 mV/V. It has been observed that adjusting widths of gate structures, as described herein, can reduce DIBL differences between single-fin devices and multi-fin devices of both n-type and/or p-type. FIG. 10 has been simplified for the sake of clarity to better understand the inventive concepts of the present disclosure.

Figure 11:
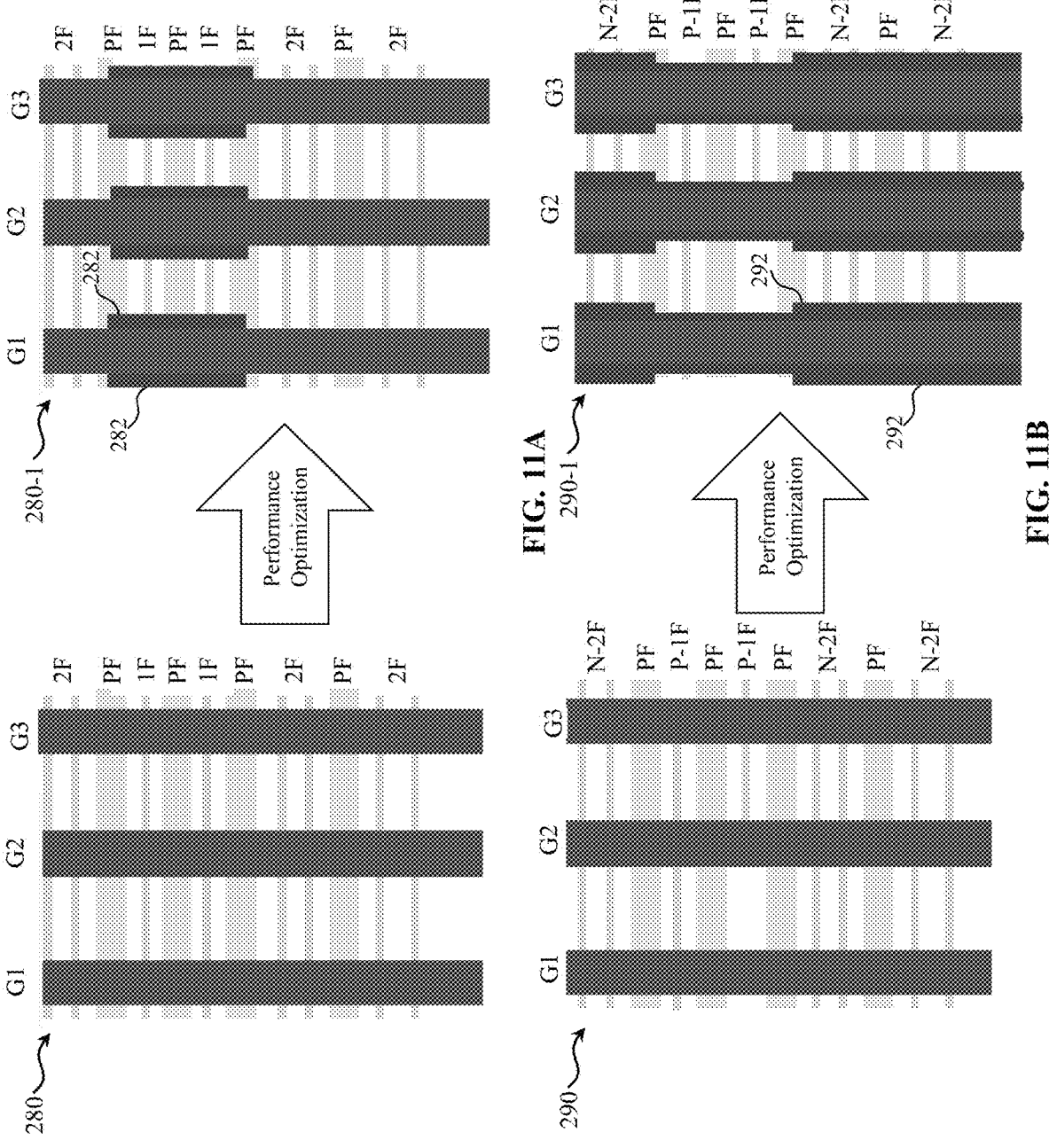
FIG. 11A and FIG. 11B are diagrammatic top views of hybrid fin device layouts, in portion or entirety, that undergo performance optimization to generate modified hybrid fin device layouts, in portion or entirety, according to various aspects of the present disclosure.

FIG. 11A is a diagrammatic top view of a hybrid fin device layout 280, in portion or entirety, that undergoes performance optimization to generate a hybrid fin device layout 280-1, in portion or entirety, having improved performance according to various aspects of the present disclosure. Hybrid fin device layout 280 is for a standard cell, such as a logic cell, that includes hybrid FinFETs. For example, hybrid fin device layout 280 includes single-fin structures 1F, two-fin structures 2F, partition fin structures PF, and gates G1-G3 common to the single-fin structures 1F, the two-fin structures 2F, and the partition fin structures PF. Single-fin FinFETs are formed from single-fin structures 1F and gate G1, gate G2, gate G3, or combinations thereof. Two-fin FinFETs are formed from two-fin structures 2F and gate G1, gate G2, gate G3, or combinations thereof. After undergoing performance optimization, such as described herein, hybrid fin device layout 280-1 includes gate extensions (jogs) 282 applied to sides of portions of gates G1-G3 that correspond with the single-fin FinFETs, such as portions of gates G1-G3 over single-fin structures 1F. In FIG. 11A, jogs 282 extend along gates G1-G3 continuously over entire widths of both single-fin structures 1F, an entire width of a partition fin structure PF between the single-fin structures 1F, and portions of widths of partition fin structures PF between the single-fin structures 1F and adjacent two-fin structures 2F. Enlarging widths of gates G1-G3 reduces differences in electrical performance, such as differences in DIBL, of the single-fin FinFETs and the two-fin FinFETs, improving performance of the logic cell fabricated according to hybrid fin device layout 280-1. In some embodiments, the single-fin FinFETs and the two-fin FinFETs exhibit substantially the same DIBL after the performance optimization. FIG. 11A has been simplified for the sake of clarity to better understand the inventive concepts of the present disclosure. Additional features can be added in hybrid fin device layout 280 and/or hybrid fin device layout 280-1, and some of the features described herein can be replaced, modified, or eliminated in other embodiments of hybrid fin device layout 280 and/or hybrid fin device layout 280-1.

FIG. 11B is a diagrammatic top view of a hybrid fin device layout 290, in portion or entirety, that undergoes performance optimization to generate a hybrid fin device layout 290-1, in portion or entirety, having improved performance according to various aspects of the present disclosure. Hybrid fin device layout 290 is for a memory cell, such as an SRAM cell, that includes hybrid FinFETs. For example, hybrid fin device layout 290 includes single-fin structures P-1F, two-fin structures N-2F, partition fin structures PF, and gates G1-G3 common to the single-fin structures P-1F, the two-fin structures N-2F, and the partition fin structures PF. P-type single-fin FinFETs are formed from single-fin structures P-1F and gate G1, gate G2, gate G3, or combinations thereof. N-type two-fin FinFETs are formed from two-fin structures N-2F and gate G1, gate G2, gate G3, or combinations thereof. After undergoing performance optimization, such as described herein, hybrid fin device layout 290-1 includes gate extensions (jogs) 292 applied to sides of gates G1-G3. In such embodiments, jogs 292 extend continuously over entire widths of p-type single-fin structures P-1F, entire widths of n-type two-fin structures N-2F, and entire widths of partition fin structures PF. In FIG. 11B, jogs 292 extend along an entire length of gates G1-G3, and jogs 292 have varying widths. For example, portions of jogs 292 applied to gates G1-G3 in n-type two-fin FinFET regions have a first width, and portions of jogs 292 applied to gates G1-G3 in p-type single-fin FinFET regions have a second width that is less than the first width. Enlarging widths of gates G1-G3 reduces differences in electrical performance, such as differences in DIBL, of the p-type single-fin FinFETs and the n-type two-fin FinFETs, improving performance of the memory cell fabricated according to hybrid fin device layout 290-1. In some embodiments, the p-type single-fin FinFETs and the n-type two-fin FinFETs exhibit substantially the same DIBL after the performance optimization. FIG. 11B has been simplified for the sake of clarity to better understand the inventive concepts of the present disclosure. Additional features can be added in hybrid fin device layout 290 and/or hybrid fin device layout 290-1, and some of the features described herein can be replaced, modified, or eliminated in other embodiments of hybrid fin device layout 290 and/or hybrid fin device layout 290-1.

Figure 12:
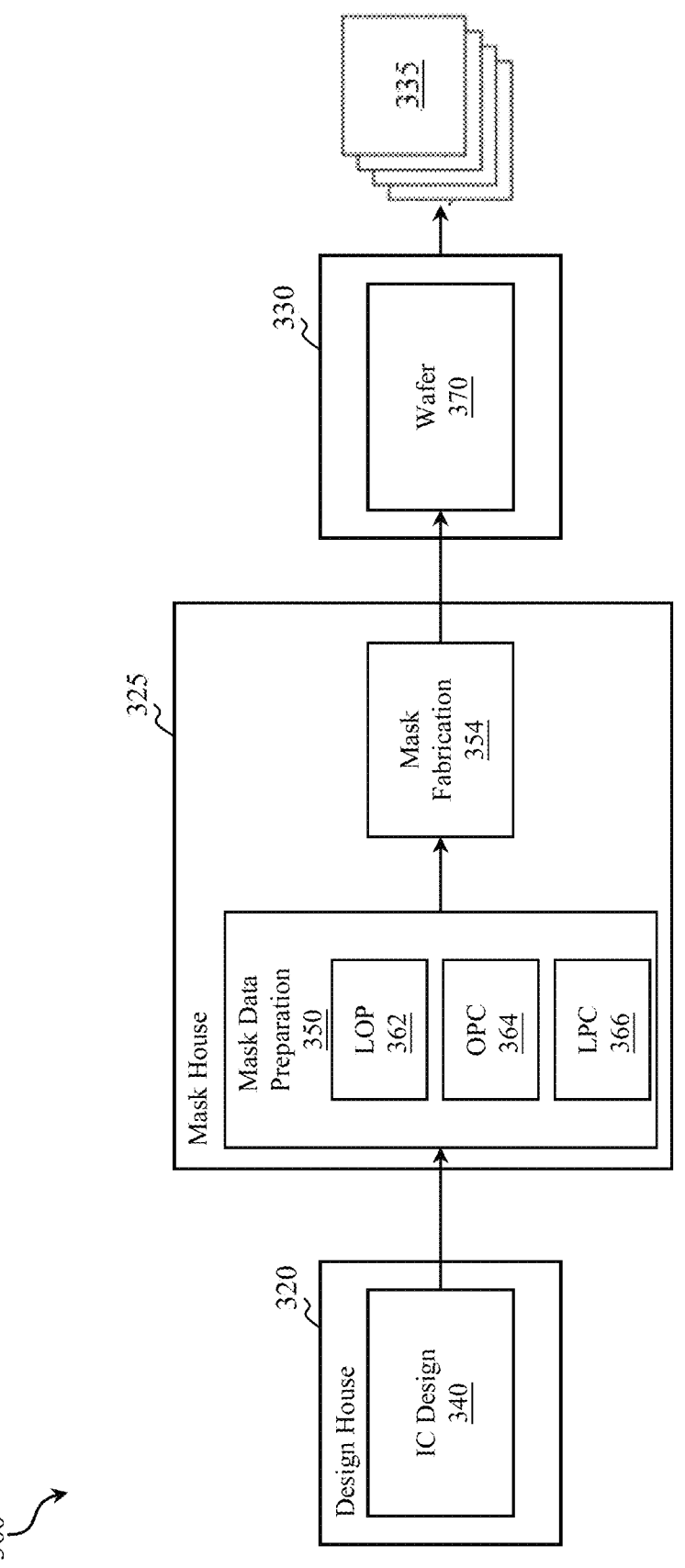
FIG. 12 is a simplified block diagram of an integrated circuit (IC) manufacturing system, along with an IC manufacturing flow associated with the IC manufacturing system, according to various aspects of the present disclosure.

FIG. 12 is a simplified block diagram of an integrated circuit (IC) manufacturing system 300, along with an IC manufacturing flow associated with IC manufacturing system 300, according to various aspects of the present disclosure. IC manufacturing system 300 includes various entities, such as a design house 320, a mask house 325, and an IC manufacturer 330 (for example, an IC fab or foundry), that interact with one another in design, development, and manufacturing cycles and/or services related to manufacturing of IC devices 335. In some embodiments, IC devices 335 are hybrid fin devices, such as those described herein. The entities are connected by a communications network, which may be a single network or multiple networks, such as an intranet and/or Internet, and may include wired and/or wireless communication channels therebetween. The entities can interact with other entities, provide services to the other entities, receive services from the other entities, or combinations thereof. In some embodiments, design house 320, mask house 325, IC manufacturer 330, or combinations thereof belong to a single entity (e.g., operated by a single party, coexist in a common facility, etc.) or separated entities (e.g., operated by independent parties). FIG. 12 has been simplified for the sake of clarity to better understand the inventive concepts of the present disclosure. Additional features can be added in IC manufacturing system 300, and some of the features described herein can be replaced, modified, or eliminated in IC manufacturing system 300.

Design house 320, which may include one or more design teams, generates an IC design layout 340 in an IC design phase of fabricating IC devices 335. Design layout 340 includes descriptions of various geometrical patterns designed for performing specific functions that conform to performance specifications and/or manufacturing specifications. The geometrical patterns represent circuit features of IC devices 335, e.g., metal layers, dielectric layers, or semiconductor layers, that form various IC components, such as active regions (e.g., fin active regions), gate structures (e.g., a gate stack and gate spacers), and conductive lines and/or vias (i.e., interconnects). In some embodiment, design house 320 implements a design procedure to form design layout 340. The design procedure may include, but is not limited to, logic design, physical design, pre-layout simulation, placement and routing, timing analysis, parameter extraction, design rule check, and post-layout simulation. Design layout 340 can be converted from description texts into visual equivalents that provide a physical layout of the depicted patterns, such as dimensions, shapes, and locations thereof. In some embodiments, design layout 340 can be expressed in an Open Artwork System Interchange Standard (OASIS) file format, a GDS file format, a GDSII file format, DFII file format, other suitable file format, or combinations thereof.

In some embodiments, mask house 325 receives design layout 340 from design house 320, for example, via a network connection, such as described above. Mask house 325 uses design layout 340 to manufacture one or more masks to be used for fabricating various layers of IC devices 335 according to design layout 340. Mask house 325 can perform mask data preparation 350, where design layout 340 is translated into a form that can be physically written by a mask writer, and mask fabrication 354, where design layout prepared by mask data preparation 350 is modified to comply with a particular mask writer and/or mask manufacturer and is then fabricated. In FIG. 12, mask data preparation 352 and mask fabrication 354 are illustrated as separate elements. However, in some embodiments, mask data preparation 352 and mask fabrication 354 may be collectively referred to as mask data preparation.

In some examples, mask data preparation 350 includes application of one or more resolution enhancement technologies (RETs), such as phase shift masks (PSMs), off-axis illumination (OAI), optical proximity correction (OPC), and inverse lithography technology (ILT) to compensate for potential lithography errors, such as those that can arise from diffraction, interference, or other process effects. In some embodiments, RETs (e.g., such as OPC or ILT) may be used to modify mask layouts to compensate for processing limitations of processes used to manufacture IC devices 335 and which manifest themselves as process technology nodes are scaled down. Without RETs, simple scaling down of layout designs used at larger nodes often results in IC devices having inaccurate or poorly shaped features. In some embodiments, mask data preparation 350 includes logic operation (LOP) 362, OPC 364, lithography process check (LPC) 366, other mask data preparation processes, or combinations thereof.

LOP 362 includes receiving and/or defining design rules that specify manufacturing constraints from various IC manufacturers and checking design layout 340 based on the design rules. The design rules can include line width constraints (e.g., fin widths, gate widths, etc.), spacing constraints between adjacent features (e.g., fin spacing for single-fin structures, multi-fin structures, partition fin structures, etc. and/or gate spacing), other constraints, or combinations thereof. The design rules may be implemented as logic operations. In some embodiments, LOP 362 includes analyzing design layout 340 and modifying design layout 340 according to the design rules and/or manufacturing rules. If features (e.g., patterns, polygons, lines, etc.) in design layout 340 do not comply with the design rules, LPC 362 can modify design layout 340 until it complies with the design rules. LOP 362 may thus generate a modified design layout (i.e., design layout 340 having modifications thereto).

Modifications of design layout 340 can include resizing, reshaping, reallocating, or combinations thereof the features of design layout 340.

OPC 364 can perform rule-based modifications and/or model-based modifications to design layout 340. For rule-based modification, OPC 364 may modify design layout 340 based on OPC rules that account for environmental impacts associated with IC fabrication. In some embodiments, one or more OPC rules may define how to modify gate structures of hybrid fin devices, and OPC 364 modifies a hybrid fin device layout based on the OPC rules. For example, accounting for electrical characteristic differences in single-fin devices and multi-fin devices of a hybrid fin device, OPC rules may specify locations for applying jogs to the gate structure or portions thereof (thereby enlarging the gate structure) and/or widths of the jogs to be applied to the gate structure and OPC 364 may modify design layout 340 accordingly. In another example, OPC rules may specify locations for reducing a width of the gate structure or portions thereof and/or amounts of width reduction and OPC 364 may modify design layout 340 accordingly. In yet another example, OPC rules may specify that jogs (e.g., OPC features) are to be applied to gate structures of single-fin devices. For model-based modification, OPC 364 may modify design layout 340 by simulating a printed image on a wafer based on design layout 340 using a lithography process model and modifying design layout 340 until the simulated printed image matches a desired wafer image. Model-based OPC may compensate for imaging errors, such as diffraction, interference, or other effects arising from lithography processes. In various examples, OPC 364 may be used to adjust line widths depending on density of surrounding geometries, add "dog-bone" endcaps to ends of lines to prevent line end shortening, correct for e-beam proximity effects, for other purposes, or combinations thereof. OPC 364 may also be used to add sub-resolution assist features, which are not printable features, such as scattering bars, serifs, hammerheads, etc. to design layout 340 according to a lithography model such that, after a lithography process, a final pattern on a wafer is improved with enhanced resolution and precision.

LPC 366 can include simulating IC fabrication processes that will be implemented by IC manufacturer 330 to fabricate IC devices 335. LPC 366 may simulate this processing based on design layout 340 (or design layout 340 after undergoing LOP 362 and/or OPC 364) to create a simulated, manufactured IC device representative of IC devices 335 (e.g., a hybrid fin device). The simulation may include electrical performance characteristics of the simulated IC device. The simulation may be based on an entirety or a portion of design layout 340. In some embodiments, LPC 366 includes inspecting design layout 340 and/or the simulated IC device and detecting any potential problematic areas, which can be referred to as hotspots, that may appear in IC devices 335 if fabricated based on design layout 340 (or design layout 340 as modified by LOP 362 and/or OPC 364). Hotspots may be features and/or regions of IC devices 335 that exhibit characteristics that negatively impact electrical performance thereof. For example, LPC 366 may identify regions of design layout 340 where DIBL of a transistor is greater than a threshold DIBL and/or regions having transistors with DIBL differences. In another example, LPC 366 may identify areas of design layout 340 prone to current leakage or exhibiting current leakage greater than a threshold. The processing parameters in LPC simulation may include parameters associated with various processes of the IC manufacturing cycle, parameters associated with tools used for manufacturing the IC, other aspects of the manufacturing process, or combinations thereof. By way of example, LPC may take into account various factors, such as aerial image contrast, depth of focus ("DOF"), mask error enhancement factor ("MEEF"), other suitable factors, or combinations thereof.

After mask data preparation 352 and during mask fabrication 354, a mask or a group of masks may be fabricated based on design layout 340, as modified as described herein. For example, an electron-beam (e-beam) or a mechanism of multiple e-beams is used to form a pattern on a mask (photomask or reticle) based on the modified design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque regions and transmitted through the transparent regions. In one example, a binary mask includes a transparent substrate (e.g., fused quartz) and an opaque material (e.g., chromium) coated in the opaque regions of the mask. In some examples, the mask is formed using phase shift technology. In a phase shift mask (PSM), various features in the pattern formed on the mask are configured to have a pre-configured phase difference to enhance image resolution and/or imaging quality. In various examples, the phase shift mask can be an attenuated PSM or alternating PSM. In some embodiments, the mask (or masks) is an extreme (EUV) mask used during EUV lithography processes.

In some embodiments, IC manufacturer 330, such as a semiconductor foundry, uses the mask (or masks) fabricated by mask house 325 to transfer one or more mask patterns onto a wafer 370 and thus fabricate IC devices 335 on wafer 370. For example, IC manufacturer 330 can fabricate hybrid fin devices, such as those described herein, on wafer 370. IC manufacturer 330 can include an IC fabrication facility that can include multiple manufacturing facilities for fabricating different IC products and/or different portions of the IC products. For example, IC manufacturer 330 may include a first manufacturing facility for front end fabrication of IC products (i.e., front-end-of-line (FEOL) fabrication), a second manufacturing facility for back end fabrication of IC products, such as interconnection and/or packaging thereof (i.e., back-end-of-line (BEOL) fabrication), and a third manufacturing facility for providing other services of the foundry business. In some embodiments, a semiconductor wafer (i.e., production wafer 370) within and/or upon which IC devices 335 are fabricated can include a silicon substrate or other substrate having material layers formed thereon. In some embodiments, the semiconductor wafer may further include various doped regions, dielectric features, and multilevel interconnects (formed at subsequent manufacturing steps). Moreover, the mask (or masks) may be used in a variety of processes during IC fabrication. For example, the mask(s) may be used in an ion implantation process to form various doped regions in the semiconductor wafer, in an etching process to form various etched regions in the semiconductor wafer, and/or in other suitable processes. In some embodiments, IC manufacturer 330 dices wafer 370 along defined regions, such as scribe line regions, to separate IC devices 335. In some embodiments, IC manufacturer 330 tests IC devices 335 on wafer 370 before dicing or after dicing. The testing can include determining whether IC devices 335 meet physical manufacturing specifications, mechanical performance specifications, electrical performance specifications, other specifications, or combinations thereof.

Figure 13:
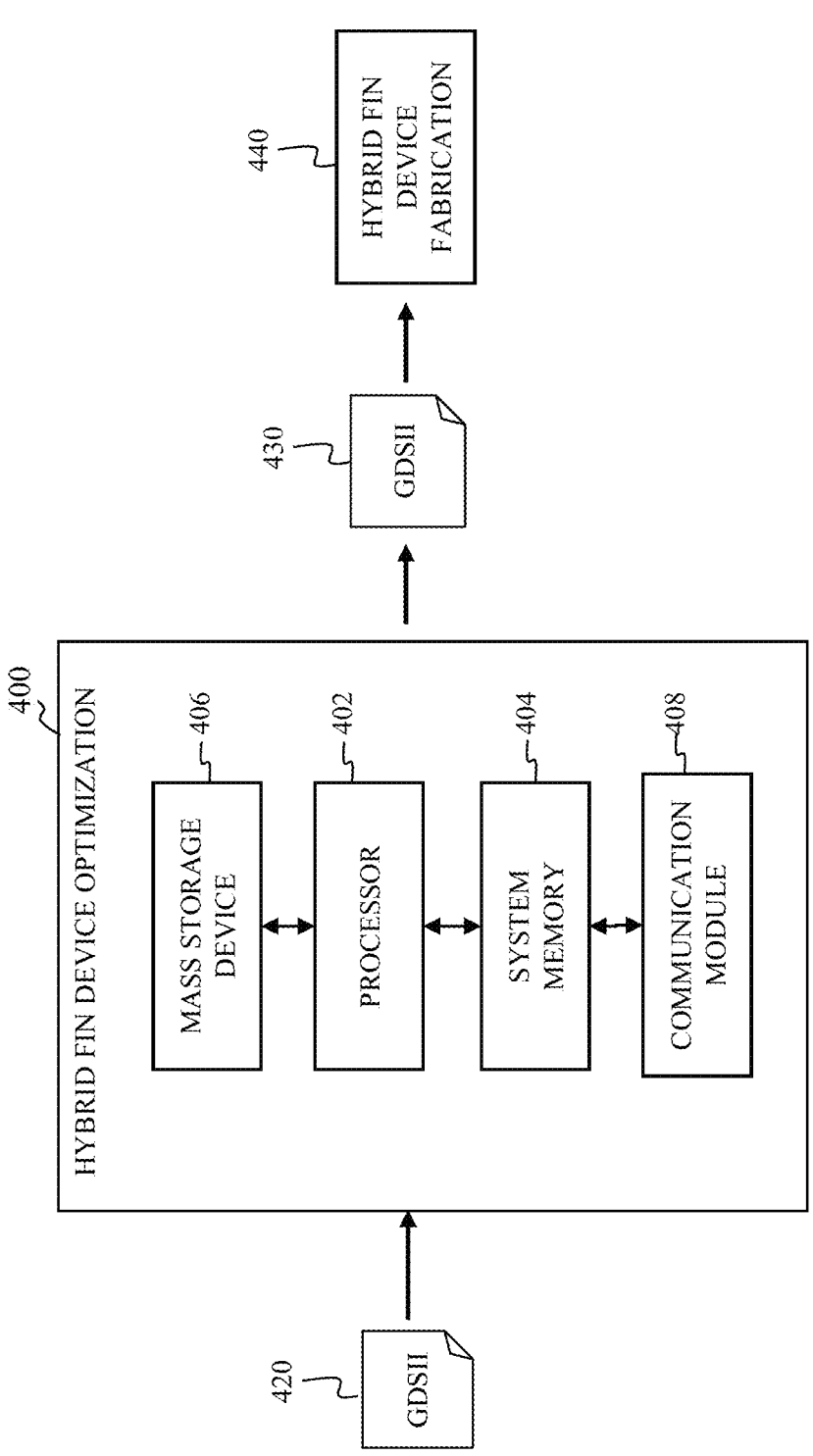
FIG. 13 is a simplified block diagram of a hybrid fin device optimization system according to various aspects of the present disclosure.

FIG. 13 is a simplified block diagram of a hybrid fin device optimization system 400 according to various aspects of the present disclosure. Design house 320 and/or mask house 325 may include and/or implement hybrid fin device optimization system 400. Hybrid fin device optimization system 400 is operable to perform the hybrid fin device optimization techniques described herein and in association with FIGS. 4-12. Hybrid fin device optimization system 400 is an information handling system, such as a computer, server, workstation, or other suitable device. Hybrid fin device optimization system 400 includes a processor 402 that is communicatively coupled to a system memory 404, a mass storage device 406, and a communication module 408. System memory 404 provides processor 402 with non-transitory, computer-readable storage to facilitate execution of computer instructions by processor 402. Examples of system memory 404 may include random access memory (RAM) devices, such as dynamic RAM (DRAM), synchronous DRAM (SDRAM), solid state memory devices, a variety of other memory devices, or combinations thereof. Computer programs, instructions, and data are stored within mass storage device 406. Examples of mass storage device 406 may include hard discs, optical disks, magneto-optical discs, solid-state storage devices, a variety of other mass storage devices, or combinations thereof. Communication module 408 is operable to communicate information, such as IC design layout files, with components in an IC manufacturing system. Examples of communication module 408 may include Ethernet cards, 802.11 WiFi devices, cellular data radios, and/or other suitable devices known in the art.

In operation, hybrid fin device optimization system 400 is configured to receive and manipulate a hybrid fin device layout 420 (e.g., hybrid fin device layout 100) according to a hybrid fin device optimization process (e.g., method 200 or methods associated with FIGS. 4-8, FIG. 10, FIG. 11A, FIG. 11B, and FIG. 12), such as described herein, thereby generating an optimized hybrid fin device layout (e.g., hybrid fin device layouts 100-1-100-5) that can be transferred for hybrid fin device fabrication 440 (e.g., to mask house 325 and/or IC manufacturer 330). A hybrid fin device fabricated according to the optimized hybrid fin device layout will have single-fin devices and multi-fin devices having a common gate having a non-uniform width along its length. In some embodiments, the hybrid fin device optimization process (e.g., method 200 or methods associated with FIGS. 4-8, FIG. 10, FIG. 11A, FIG. 11B, and FIG. 12) may be implemented as software instructions executing on hybrid fin device optimization system 400. In some embodiments, mask data preparation 325, including LOP, OPC, and LPC and corresponding hybrid fin optimization processes, may be implemented as software instructions executing on hybrid fin device optimization system 400. Further, hybrid fin device optimization system 400 may include additional and/or different components in alternative embodiments.

Hybrid fin devices having improved performance are described herein. An exemplary method includes receiving a hybrid fin device layout for a hybrid fin device. The hybrid fin device layout includes a single-fin active region, a multi-fin active region, and a fin partition region between the single-fin active region and the multi-fin active region. The single-fin active region, the multi-fin active region, and the fin partition region extend lengthwise along a first direction. A gate is disposed over the single-fin active region, the multi-fin active region, and the fin partition region. The gate extends lengthwise along a second direction, the second direction is different than the first direction, and the gate has a width along the first direction. The single-fin active region and a first portion of the gate form a first fin-based device having a first electrical characteristic and the multi-fin active region and a second portion of the gate form a second fin-based device having a second electrical characteristic. The second electrical characteristic is different than the first electrical characteristic. The method further includes tuning the width of the gate to reduce a difference between the first electrical characteristic and the second electrical characteristic. The tuning generates a modified hybrid fin device layout. The method further includes fabricating the hybrid fin device using the modified hybrid fin device layout. In some embodiments, the method further includes simulating electrical performance of the hybrid fin device based on the hybrid fin device layout, and the tuning the width includes adjusting the width based on the simulated electrical performance.

In some embodiments, tuning the width includes enlarging the width of the gate over the single-fin active region. In some embodiments, tuning the width includes reducing the width of the gate over the single-fin active region. In some embodiments, tuning the width includes enlarging the width of the gate over the multi-fin active region. In some embodiments, tuning the width includes reducing the width of the gate over the multi-fin active region. In some embodiments, the first electrical characteristic is a first drain-induced barrier lowering (DIBL) and the second electrical characteristic is a second DIBL.

Another exemplary method includes receiving a hybrid fin device layout for a hybrid fin device. The hybrid fin device includes a gate structure that is common to a single-fin device and a multi-fin device. The method further includes, based on an optical proximity correction (OPC)-based rule, determining that a difference in a first electrical characteristic of the single-fin device and a second electrical characteristic of the multi-fin device is greater than a threshold difference. The first electrical characteristic and the second electrical characteristic depend on a width of the gate structure. The method further includes adjusting a width of a portion of the gate structure to reduce the difference in the first electrical characteristic and the second electrical characteristic, which modifies the hybrid fin device layout and improves overall electrical performance of the hybrid fin device. The method further includes fabricating the hybrid fin device using the modified hybrid fin device layout.

In some embodiments, the gate structure has a first width and the adjusting the width includes adding at least one jog to the portion of the gate structure, such that the portion of the gate structure has a second width that is greater than the first width. In some embodiments, the method further includes generating a simulated hybrid fin device based on the hybrid fin device layout, and the first electrical characteristic and the second electrical characteristic are determined from the simulated hybrid fin device. In some embodiments, the gate structure has a first width, the portion of the gate structure is a portion of the single-fin device, the first electrical characteristic is a first drain-induced barrier lowering (DIBL), the second electrical characteristic is a second DIBL that is less than the first DIBL, and adjusting the width of the portion of the gate structure includes enlarging the portion of the gate structure from the first width to a second width to reduce a difference between the first DIBL and the second DIBL.

An exemplary hybrid fin device includes a single-fin structure, a multi-fin structure, and a partition fin structure disposed between the single-fin structure and the multi-fin structure. The single-fin structure, the multi-fin structure, and the partition fin structure extend lengthwise along a first direction. A gate is disposed over the single-fin structure, the multi-fin structure, and the partition fin structure. The gate extends lengthwise along a second direction, the second direction is different than the first direction, the gate has a first width over the single-fin structure, the gate has a second width over the multi-fin structure, and the first width and the second width are along the first direction and the second width is different than the first width. In some embodiments, a first electrical characteristic of a first transistor formed from the single-fin structure and the gate is about the same as a second electrical characteristic of a second transistor formed from the multi-fin structure and the gate. In some embodiments, the first electrical characteristic is a first drain-induced barrier lowering (DIBL) and the second electrical characteristic is a second DIBL. The first DIBL is substantially the same as the second DIBL.

In some embodiments, the first width is greater than the second width and a first electrical characteristic of a first fin-based device formed from the single-fin structure and the gate is about the same as a second electrical characteristic of a second fin-based device formed from the multi-fin structure and the gate. In some embodiments, a first portion of the gate is over the single-fin structure, a second portion of the gate is over the multi-fin structure, and a third portion of the gate is over the partition fin structure. The first portion of the gate over the single-fin structure has a first extension portion having a third width and a second extension portion having a fourth width. The first portion of the gate extends beyond a first sidewall of the second portion of the gate along the first direction by the third width and beyond a second sidewall of the second portion of the gate along the first direction by the fourth width. The first width is a sum of the second width, the third width, and the fourth width. In some embodiments, the first width is less than the second width and a first electrical characteristic of a first fin-based device formed from the single-fin structure and the gate is about the same as a second electrical characteristic of a second fin-based device formed from the multi-fin structure and the gate. In some embodiments, a first portion of the gate is over the single-fin structure, a second portion of the gate is over the multi-fin structure, and a third portion of the gate is over the partition fin structure. The second portion of the gate over the multi-fin structure has a first extension portion having a third width and a second extension portion having a fourth width. The second portion of the gate extends beyond a first sidewall of the first portion of the gate along the first direction by the third width and beyond a second sidewall of the first portion of the gate along the first direction by the fourth width. The second width is a sum of the first width, the third width, and the fourth width. In some embodiments, the gate has a third width and a fourth width over the partition fin structure, the third width and the fourth width are along the first direction, the third width equals the first width, and the fourth width equals the second width. In some embodiments, the first width is about 5% to about 30% different than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a hybrid fin device layout for a hybrid fin device, wherein the hybrid fin device layout includes:
    a single-fin active region, a multi-fin active region, and a fin partition region between the single-fin active region and the multi-fin active region, wherein the single-fin active region, the multi-fin active region, and the fin partition region extend lengthwise along a first direction,
    a gate disposed over the single-fin active region, the multi-fin active region, and the fin partition region, wherein the gate extends lengthwise along a second direction, the second direction is different than the first direction, and the gate has a width along the first direction, and
    the single-fin active region and a first portion of the gate form a first fin-based device having a first electrical characteristic and the multi-fin active region and a second portion of the gate form a second fin-based device having a second electrical characteristic, wherein the second electrical characteristic is different than the first electrical characteristic;
tuning the width of the gate to reduce a difference between the first electrical characteristic and the second electrical characteristic, wherein the tuning includes generating a modified hybrid fin device layout; and
fabricating the hybrid fin device using the modified hybrid fin device layout.

2. The method of claim 1, wherein the tuning the width includes enlarging the width of the gate over the single-fin active region.

3. The method of claim 2, wherein the enlarging the width of the gate over the single-fin active region includes adding a first gate extension and a second gate extension along opposites sides, respectively, of the gate over the single-fin active region.

4. The method of claim 3, wherein the width is a first width, each of the first gate extension and the second gate extension has a second width, and the second width is about 0.15 nm to about 1.0 nm.

5. The method of claim 1, wherein the tuning the width includes reducing the width of the gate over the single-fin active region.

6. The method of claim 1, wherein the tuning the width includes enlarging the width of the gate over the multi-fin active region.

7. The method of claim 1, wherein the tuning the width includes reducing the width of the gate over the multi-fin active region.

8. The method of claim 1, wherein the first electrical characteristic is a first drain-induced barrier lowering (DIBL) and the second electrical characteristic is a second DIBL.

9. The method of claim 1, further comprising simulating electrical performance of the hybrid fin device based on the hybrid fin device layout, wherein the tuning the width includes adjusting the width based on the simulated electrical performance.

10. The method of claim 1, wherein the width is a first width, the tuning the width includes enlarging the first width of the gate to a second width, and the second width is about 5% to about 30% greater than the first width.

11. A method comprising:
receiving a hybrid fin device layout for a hybrid fin device, wherein the hybrid fin device includes a gate structure that is shared by a single-fin device and a multi-fin device;
based on an optical proximity correction (OPC)-based rule, determining that a difference in a first electrical characteristic of the single-fin device and a second electrical characteristic of the multi-fin device is greater than a threshold difference, wherein the first electrical characteristic and the second electrical characteristic depend on a width of the gate structure;
adjusting the width of a portion of the gate structure to reduce the difference in the first electrical characteristic and the second electrical characteristic, thereby modifying the hybrid fin device layout and improving overall electrical performance of the hybrid fin device; and
fabricating the hybrid fin device using the modified hybrid fin device layout.

12. The method of claim 11, wherein:
the width is a first width; and
the adjusting the width includes adding at least one jog to the portion of the gate structure, such that the portion of the gate structure has a second width that is greater than the first width.

13. The method of claim 11, further comprising generating a simulated hybrid fin device based on the hybrid fin device layout, wherein the first electrical characteristic and the second electrical characteristic are determined from the simulated hybrid fin device.

14. The method of claim 11, wherein:
the width is a first width;
the portion of the gate structure is a portion of the single-fin device;
the first electrical characteristic is a first drain-induced barrier lowering (DIBL);
the second electrical characteristic is a second DIBL that is less than the first DIBL; and
the adjusting the width of the portion of the gate structure includes enlarging the portion of the gate structure from the first width to a second width to reduce a difference between the first DIBL and the second DIBL.

15. A method comprising:
receiving a hybrid fin device layout for a hybrid fin device that includes:
    a single-fin structure, a multi-fin structure, and a partition fin structure disposed between the single-fin structure and the multi-fin structure, wherein the single-fin structure, the multi-fin structure, and the partition fin structure extend lengthwise along a first direction,
    a gate disposed over the single-fin structure, the multi-fin structure, and the partition fin structure, wherein the gate extends lengthwise along a second direction different than the first direction,
    the single-fin structure and a first portion of the gate form a first fin-based device having a first electrical characteristic and the multi-fin structure and a second portion of the gate form a second fin-based device having a second electrical characteristic different than the first electrical characteristic, and the first portion of the gate and the second portion of the gate have a first width, wherein the first width is along the first direction, and increasing the first width of the first portion of the gate to a second width to reduce a difference between the first electrical characteristic and the second electrical characteristic, thereby generating a modified hybrid fin device layout; and fabricating the hybrid fin device using the modified hybrid fin device layout.

16. The method of claim 15, wherein a third portion of the gate is over the partition fin structure and the method further includes increasing the first width of at least a portion of the third portion of the gate to the second width.

17. The method of claim 15, wherein:

the single-fin structure has a first fin width along the second direction;

the multi-fin structure has a second fin width along the second direction; and the partition fin structure has a third fin width along the second direction, wherein the third fin width is greater than the first fin width and the second fin width.

18. The method of claim 15, wherein:

the increasing the first width of the first portion of the gate to the second width includes adding a first gate extension and a second gate extension along opposites sides, respectively, of the first portion of the gate; and the first gate extension has a third width along the first direction, the second gate extension has a fourth width along the first direction, the third width is less than the first width, and the fourth width is less than the first width; and the second width is a sum of the first width, the third width, and the fourth width.

19. The method of claim 15, wherein:

the first electrical characteristic is a first drain-induced barrier lowering (DIBL);

the second electrical characteristic is a second DIBL different than the first DIBL; and the first DIBL is substantially the same as the second DIBL after the increasing the first width of the first portion of the gate to the second width.

20. The method of claim 15, wherein the first width of the first portion of the gate is increased about 0.3 nm to about 2.0 nm.

* * * * *